US006679618B1

(12) United States Patent
Suckow et al.

(10) Patent No.: US 6,679,618 B1
(45) Date of Patent: Jan. 20, 2004

(54) LIGHT EMITTING DIODE 360 DEGREE WARNING LAMP

(75) Inventors: Chris Allen Suckow, Kennedy, NY (US); Gregory Pond, Jamestown, NY (US); Philip C. Roller, Ashville, NY (US); Paul G. Sniegocki, Erie, PA (US)

(73) Assignee: Truck Lite Co., Inc., Falconer, NY (US)

( * ) Notice: Subject to any disclaimer, the term of this patent is extended or adjusted under 35 U.S.C. 154(b) by 146 days.

(21) Appl. No.: 09/709,879

(22) Filed: Nov. 10, 2000

Related U.S. Application Data

(63) Continuation of application No. 08/953,161, filed on Oct. 17, 1997, now Pat. No. 6,183,100.

(51) Int. Cl.[7] ................................................. F21V 7/00
(52) U.S. Cl. ......................... 362/247; 362/35; 362/298
(58) Field of Search ............................... 362/545, 236, 362/247, 363, 543, 544, 227, 232, 243, 35; 340/468, 472, 473, 478, 487, 488, 471

(56) References Cited

U.S. PATENT DOCUMENTS

| | | | |
|---|---|---|---|
| 3,784,809 A | * 1/1974 | Smith ........................ 340/471 |
| 5,006,971 A | 4/1991 | Jenkins ....................... 362/252 |
| 5,361,190 A | 11/1994 | Roberts et al. ................ 362/61 |
| 5,517,388 A | 5/1996 | Hutchisson .................. 362/35 |
| 5,528,474 A | 6/1996 | Roney et al. ................ 362/249 |
| 5,585,783 A | * 12/1996 | Hall ........................... 340/473 |
| 5,642,933 A | * 7/1997 | Hitora ........................ 362/243 |
| 5,806,965 A | 9/1998 | Deese ......................... 362/249 |
| 5,838,247 A | * 11/1998 | Bladowski ............. 340/815.45 |
| 5,890,794 A | 4/1999 | Abtahi et al. ................ 362/294 |
| 6,183,100 B1 | * 2/2001 | Suckow et al. ............. 340/471 |

* cited by examiner

Primary Examiner—Alan Cariaso
Assistant Examiner—Ismael Negron
(74) Attorney, Agent, or Firm—The Bilicki Law Firm, PC

(57) ABSTRACT

A light emitting diode warning lamp which meets selected Society of Automotive Engineers Standards. The invention comprises a housing, a printed circuit board secured within the housing, a plurality of light emitting diodes mounted to the printed circuit board and operatively arranged to produce light in substantially a 360° arc surrounding the housing in a horizontal plane, and a driving circuit operatively arranged to flash the plurality of light emitting diodes.

52 Claims, 21 Drawing Sheets

LIGHT EMITTING DIODE 360 DEGREE WARNING LAMP

The present application is a continuation of U.S. patent application, Ser. No. 08/953,161, filed Oct. 17, 1997, now U.S. Pat. No. 6,183,100, issued Feb. 6, 2001, to which it claims priority and which is incorporated by reference herein.

FIELD OF THE INVENTION

The present invention relates generally to warning lamps, more particularly to a light emitting diode (LED) warning lamp, and, even more particularly, to an LED warning lamp for a vehicle which emits light in a 360° arc.

BACKGROUND OF THE INVENTION

The Society of Automotive Engineers (SAE) publishes many new, revised, and reaffirmed standards each year in three categories, including Ground Vehicle Standards (J-Reports). Information on these standards is available on the World Wide Web at http://www.sae.org.

Two of these SAE standards are relevant to this invention. SAE J1318 pertains to gaseous discharge warning lamps for authorized emergency, maintenance, and service vehicles. The standard defines a 360° warning lamp as a lamp that projects a light in a horizontal 360° arc. The lamp appears to project a regularly repeating pattern of flashes to an observer positioned at a fixed location. The function of a 360° warning lamp is to inform other highway users to stop, to yield right-of-way, or to indicate the existence of a hazardous situation. The J1318 standard defines three different classes of warning lamps, (Classes 1, 2 and 3), and specifies different photometric requirements for each class. Reprinted herebelow are the photometric requirements, for a Class 3 warning lamp as recited in Tables 3 and 7, respectively, of J1318. (All candela-second measurements are to be made by sensors placed at least 18 meters from the source).

SAE STANDARD J1318

TABLE 3

PHOTOMETRIC REQUIREMENTS CLASS 3
360 DEG GASEOUS DISCHARGE WARNING LAMPS
Minimum Flash Energy Requirements
Zone Totals (Candela-Seconds)

| | Test Point | Flash Energy - Candela Seconds | | | |
|---|---|---|---|---|---|
| Zone | Degree | White | Yellow | Red | Signal Blue |
| #1 | 5U-V*<br>2.5U-V<br>H-V<br>2.5D-V<br>5-D-V | 40 | 20 | 10 | 5 |

TABLE 7

PHOTOMETRIC DESIGN GUIDELINES
360 DEG GASEOUS DISCHARGE WARNING LAMPS
Minimum Design Flash Energy Guidelines
Class 3 Warning Lamps

| Test | Flash Energy - Candela Seconds | | | |
|---|---|---|---|---|
| Point Degree | White | Yellow | Red | Signal Blue |
| 5U-V | 2 | 1 | 0.5 | 0.25 |
| 2.5U-V | 9 | 4.5 | 2 | 1 |
| H-V | 18 | 9 | 5 | 2.5 |
| 2.5D-V | 9 | 4.5 | 2 | 1 |
| 5D-V | 2 | 1 | 0.5 | 0.25 |

SAE J845 is written specifically for 360° warning lamps of any light source. This standard restates the requirements for 360° lamps from J1318, but also provides standards for rotating signal devices, oscillating signal devices, and flashing signal devices. The devices are classified according to intended use. Reprinted herebelow are the photometric requirements for a Class 3 warning lamp, as recited in Tables 3 and 6, respectively, of J845:

SAE STANDARD J845

TABLE 3

PHOTOMETRIC REQUIREMENTS-CLASS 3 WARNING LAMPS

| Zone | Test Points Degrees | Minimum Flash Energy Candela Seconds White | Minimum Flash Energy Candela Seconds Yellow | Minimum Flash Energy Candela Seconds Red | Minimum Flash Energy Candela Seconds Signal Blue |
|---|---|---|---|---|---|
| 1 | 5U-V<br>2.1/2U-V<br>H-V<br>2.1/2D-V<br>5D-V | 40 | 20 | 10 | 10 |

TABLE 6

PHOTOMETRIC REQUIREMENTS-CLASS 3 WARNING LAMPS

| Zone | Test Points Degrees | Minimum Flash Energy Candela Seconds White | Minimum Flash Energy Candela Seconds Yellow | Minimum Flash Energy Candela Seconds Red | Minimum Flash Energy Candela Seconds Signal Blue |
|---|---|---|---|---|---|
| 1 | 5U-V | 4.5 | 2 | 1 | 1 |
| | 2.1/2U-V | 22.5 | 11.5 | 6 | 6 |
| | H-V | 48 | 22.5 | 11 | 11 |
| | 2.1/2D-V | 22.5 | 11.5 | 6 | 6 |
| | 3D-V | 4.5 | 2 | 1 | 1 |

Both SAE Standards J1318 and J845 are incorporated herein by reference.

Heretofore, lamps which meet J1318 requirements have generally been gas discharge lamps (e.g., Xenon lamps). Lamps which meet J845 requirements have traditionally been gas discharge or incandescent lamps, although the standard is not so limited. Xenon lamps are disadvantageous in that they require high operating voltage, are susceptible to vibration, and have limited life spans. Incandescent lamps suffer from similar disadvantages. Also heretofore, no one has been able to satisfy the SAE requirements with a lamp which uses light emitting diodes.

What is needed, then, is a light assembly comprising LEDs which meets the requirements of SAE J1318 and J845.

SUMMARY OF THE INVENTION

The present invention is a light emitting diode lamp for a vehicle which meets the photometric requirements of Society of Automotive Engineers Standards J1318 and J845. The lamp comprises a housing, a printed circuit board secured within the housing, a plurality of light emitting diodes mounted to the printed circuit board and operatively arranged to produce light in a substantially 360° arc surrounding the housing in a horizontal plane.

Various embodiments of the invention are disclosed, and all meet selected SAE standards.

A primary object of the invention is to provide a light emitting diode warning lamp which meets SAE standards.

A secondary object of the invention is to provide a warning lamp which is more vibration resistant and less prone to failure than either incandescent or gas discharge lamps.

Another object of the invention is to provide a light emitting diode warning lamp which is more efficient to operate than either an incandescent or a gas discharge lamp.

These and other objects, features and advantages of the invention will become apparent from the following detailed description, the drawings, and the claims.

DETAILED DESCRIPTION OF THE PREFERRED EMBODIMENT

Figure 1A:
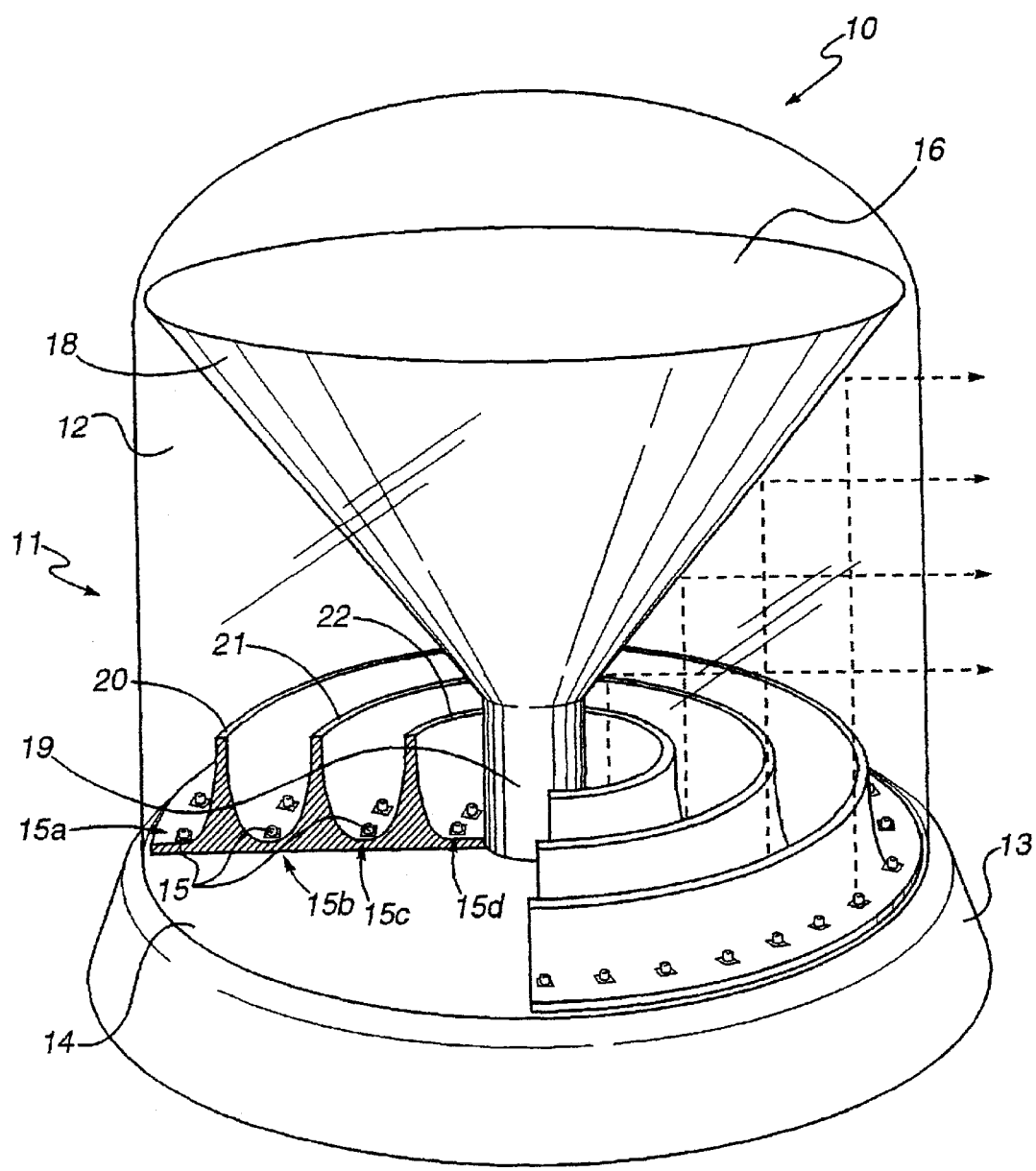
FIG. 1A is a perspective view of a first embodiment of the invention.

At the outset, is should be understood that this invention comprises a light emitting diode 360° warning lamp which meets selected SAE standards. The description which follows describes a preferred embodiment of the invention, and six alternative embodiments. It should be readily apparent, however, that various other alternative embodiments may be accomplished without departing from the scope or spirit of the invention. In the various embodiments depicted, like reference numerals refer to identical structural elements in the various drawings.

FIG. 1A illustrates a first embodiment of LED warning lamp 10. The light assembly comprises a housing 11 which has a round base 13 and a substantially cylindrical cover 12 which is secured to the base by any conventional means. The cover may be transparent or translucent, and may be clear, tinted red, amber, signal blue, or another color. The cover may be made of plastic, glass or any other suitable material. Although this embodiment is essentially "round", other shapes (square, rectangle, etc.) are obviously possible.

Figure 8A:
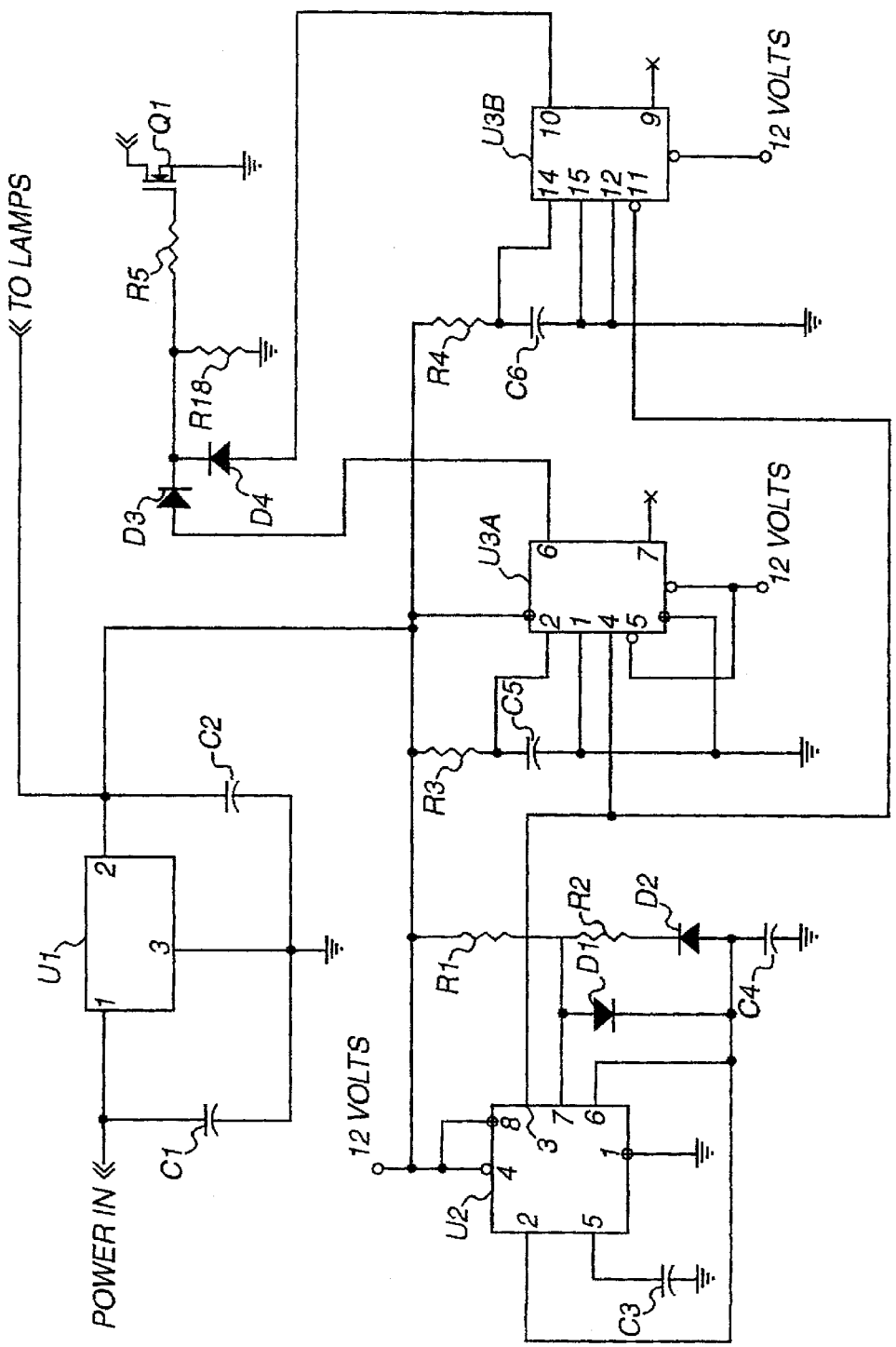
FIG. 8A is a schematic diagram of the driving circuit of the invention.

Printed circuit board 14 is secured to base 13. A plurality of light emitting diodes 15 are mounted to circuit board 14 and arranged in a concentric circular pattern. The LEDs are driven by a drive circuit which is illustrated in FIG. 8A. The components of the drive circuit may be located under circuit board 14 or may be located remotely from amp 10.

The LEDs emit light upwardly with respect to the circuit board. Since it is imperative that the warning lamp be visible from a great distance at all points about a 360° arc relative to the lamp, the light from the LEDs must be reflected so as to project radially outward from the lamp. It is preferable that as much light as possible be reflected radially outward from the lamp.

Reflector 16 functions to reflect the emitted light radially outward from the lamp. Reflector 16 comprises reflective frustoconical section 18 and non-reflective stem portion 19. The frustoconical section is coated with a reflective material to reflect light from the LEDs. Stem portion 19 is fixedly secured to base 13 through opening 17 in circuit board 14 (shown in FIG. 1B).

As shown by the dotted arrow lines in FIG. 1A, the light from the LEDs is collimated by concentrically disposed collimating reflectors 20, 21, and 22, and directed toward the reflecting surface of reflector 16, which, in turn, reflects the light in a 360° arc about the light assembly. Both main reflector 16 and collimating reflectors 20–22 are preferably injection molded out of polycarbonate, although other processes may also be used to manufacture the reflectors. The reflectors could be made out of non-plastic material as well (e.g., aluminum, stainless steel, etc.). If made from plastic, the molded polycarbonate reflectors would preferably be coated with an aluminum coating process, known in the art as vacuum metalizing. Other methods of applying a reflective coating, such as chrome plating, sputtering, in mold decoration, for example, could be used.

In operation, the driving circuit shown in FIG. 8A causes the LEDs to flash in unison, emitting light which is collimated by reflectors 20, 21, and 22, and reflected outwardly in a 360° arc by reflector 16, so as to be visible at great distances away from the warning lamp.

Figure 1B:
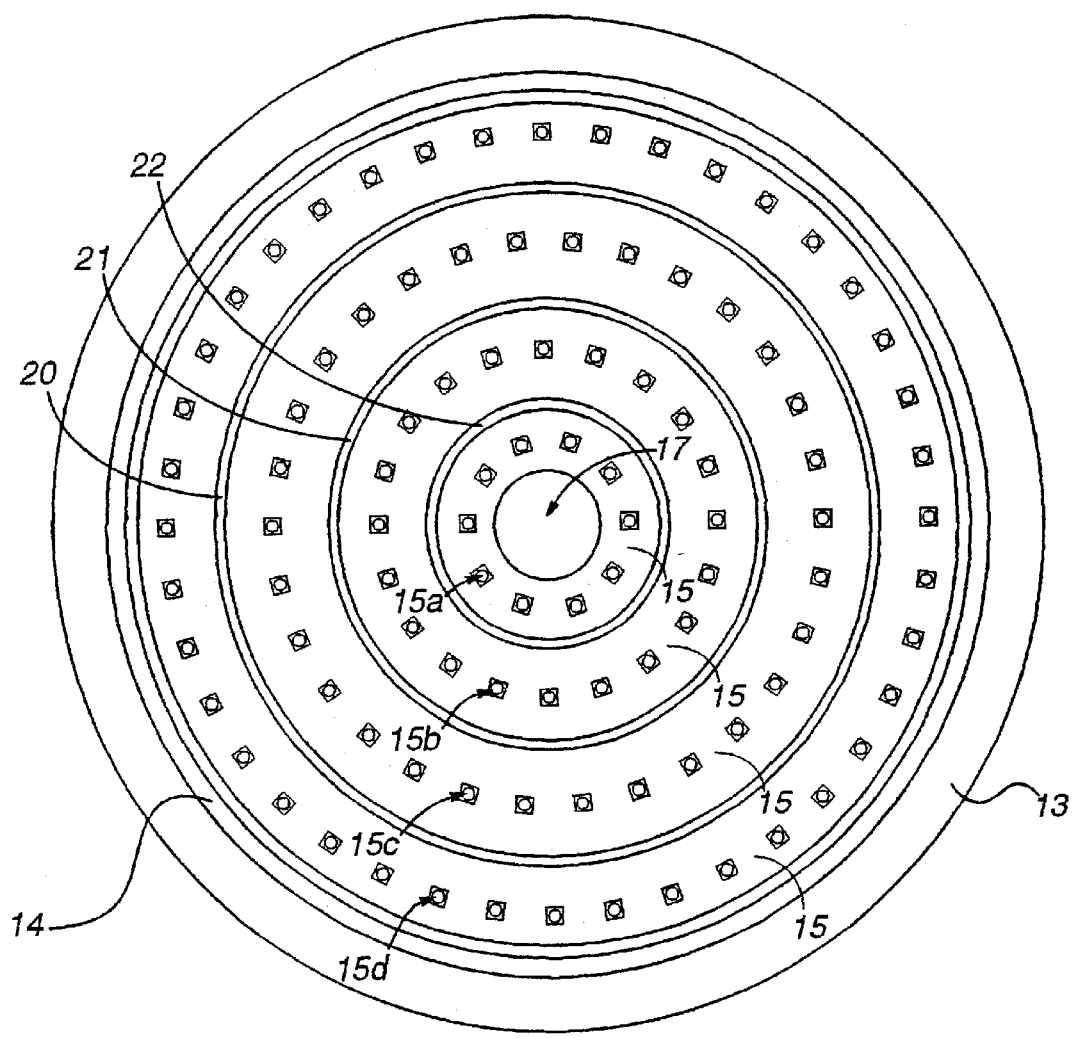
FIG. 1B is a top view of the embodiment shown in FIG. 1A, with main reflector 16 removed.

FIG. 1B is a top view of the embodiment shown in FIG. 1A, with main reflector 16 removed to show collimating reflectors 20–22 and concentric LED patterns 15a, 15b, 15c and 15d.

Figure 1C:
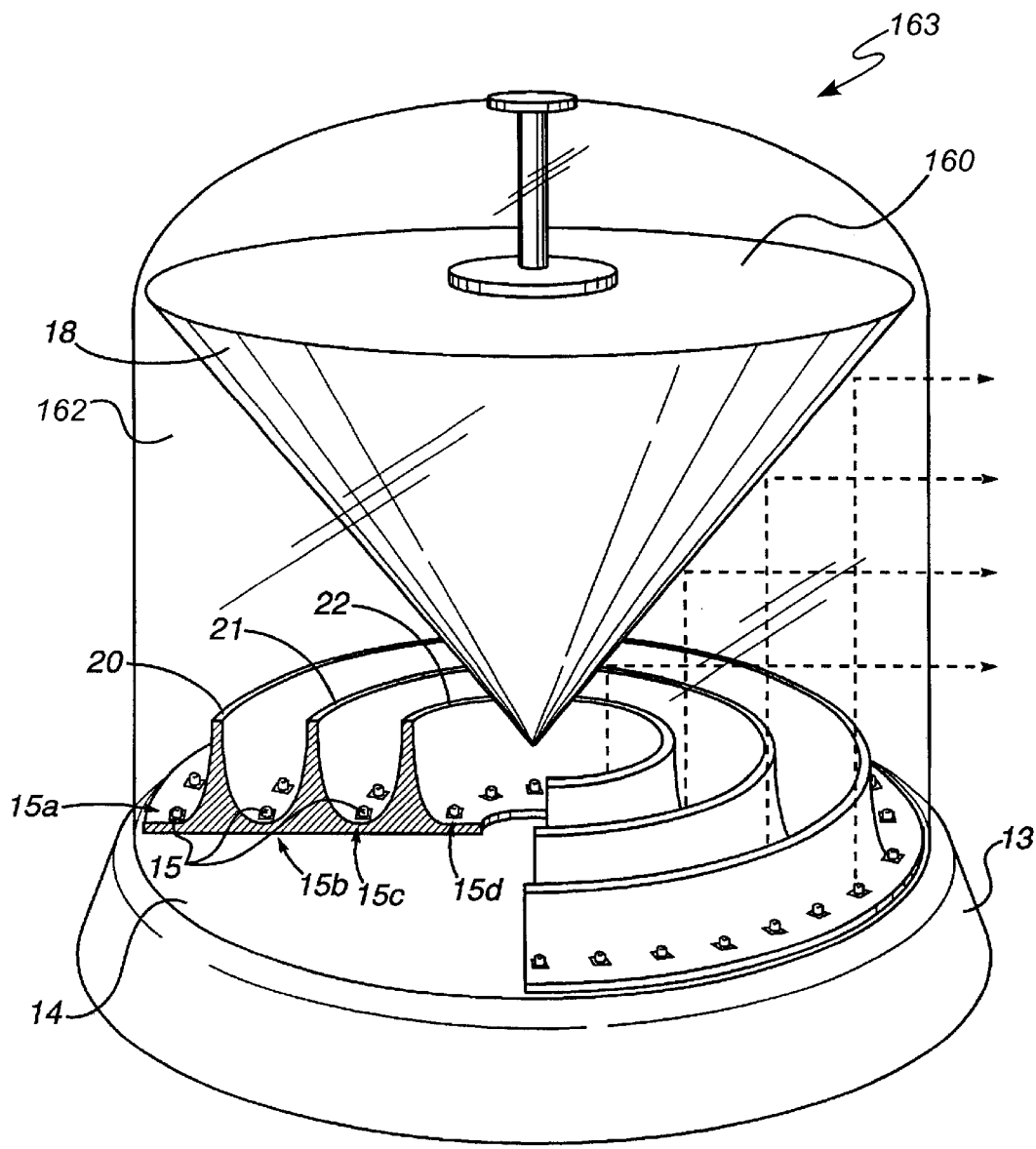
FIG. 1C is a fragmentary perspective view of the first embodiment of the invention shown in FIG. 1A, illustrating a second embodiment of the main reflector, and showing part of the collimating reflectors removed to illustrate the concentric circular LED pattern.

FIG. 1C shows LED warning lamp 163, an alternative embodiment of FIG. 1A. The lamp 163 has a main reflector 160 suspended from cover 162 instead of being supported by the base. The collimating reflectors 20, 21, and 22 are seen in relationship to the concentric circular patterns 15a, 15b, 15c, and 15d.

High light output LEDs should be used for the warning lamp. In a preferred embodiment, LEDs part no. HPWT-DL00, manufactured by Hewlett Packard were used. Other suitable Hewlett Packard LEDs are model nos. HPWT-DH00 (red), HLMT-DH08 (red) HLMP-DL08 (amber), HLMT-DL08 (amber), and HLMP-DH08 (red); although LEDs from other manufacturers may also be suitable.

Figure 2A:
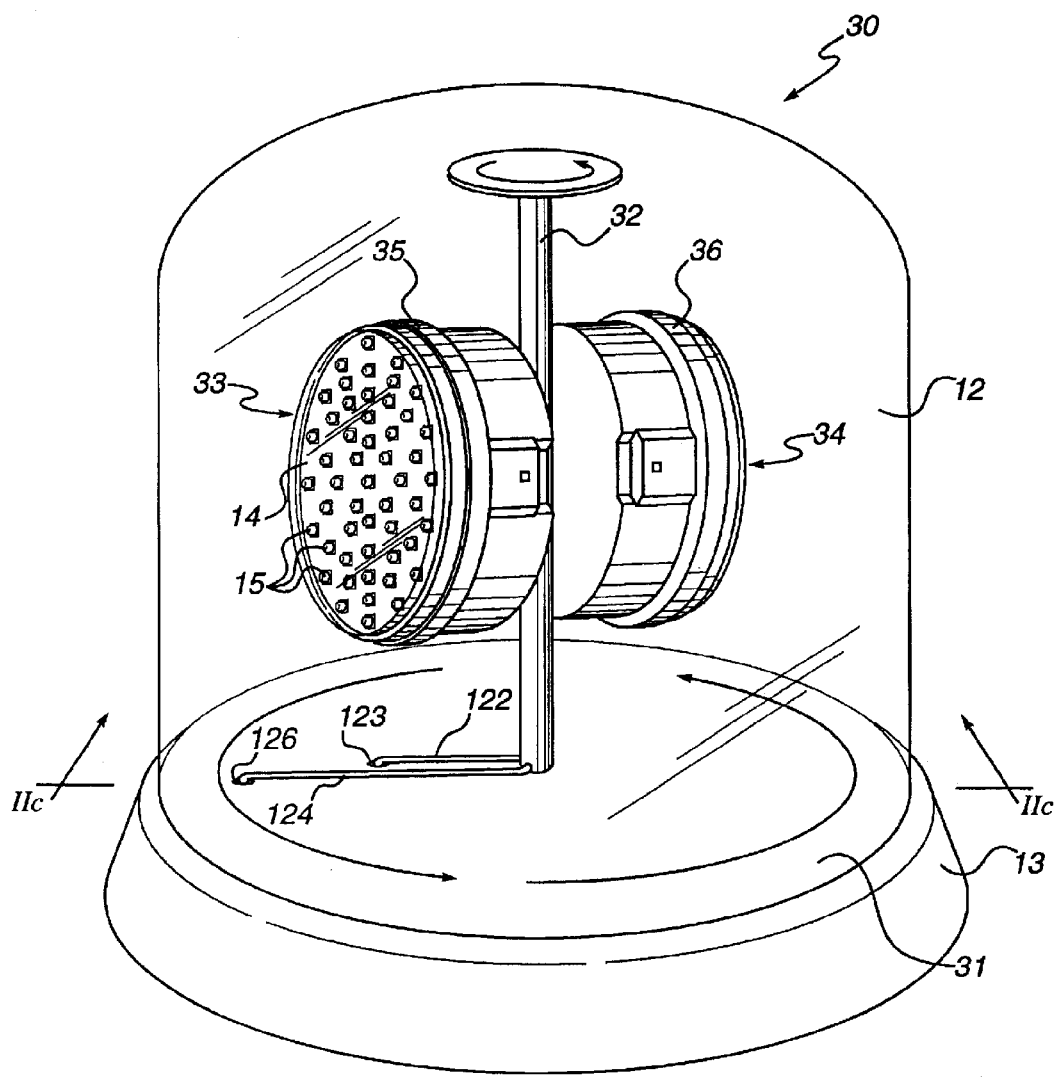
FIG. 2A is a perspective view of a second embodiment of the invention.

FIG. 2A illustrates a second embodiment 30 of the warning lamp of the invention. In this embodiment post 32 is operatively arranged for rotation with base plate 31 rotatably secured within base 13. LED lamp assemblies 33 and 34 are mounted to post 32 diametrically opposite one another. Plurality of LEDs 15 are mounted to circuit boards 14 which, in turn, are mounted to sub-housings 35 and 36, respectively. The LEDs are arranged to emit light toward cover 12. As post 32 rotates, the emitted light spans an arc of 360°. The SAE standard requires an effective or apparent flash rate of 0.8 Hz to 2.2 Hz, or 48–132 flashes/minute. It should be understood that this embodiment is not limited to two LED lamp assemblies secured to post 32. By adjusting the rotational speed, the invention can function with one, two, three or four lamp assemblies secured to the post, and still satisfy the SAE effective flash rate requirement; The apparent flash rate is obviously dependent upon how many LED assemblies are mounted to the rotating post and the rotational speed of the post. The number of flashes per rotation is equal to the number of assemblies mounted to the post. To meet the effective flash rate requirement of 0.8 Hz to 2.2 Hz, the rotational speed of the post and the number of flashes per rotation (number of assemblies per post) are related as follows:

1 flash/rotation—48 to 132 rpm,
2 flashes/rotation—24 to 66 rpm,
4 flashes/rotation—12 to 33 rpm.

Figure 2B:
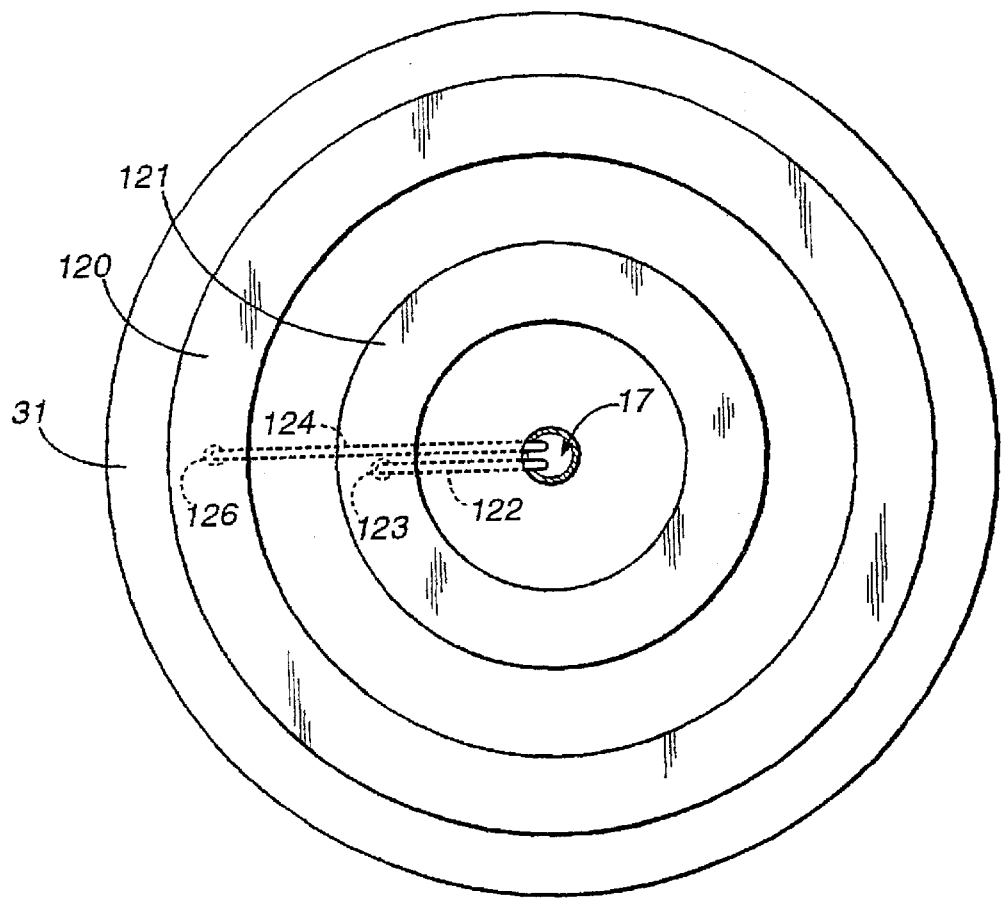
FIG. 2B is a bottom view of plate 31 shown in FIG. 2A.

Since post 32 and lamp assemblies 33 and 34 rotate, it is necessary to use a commutator to supply power to the LEDs. As shown in FIG. 2A, power supply leads 122 and 124 travel from the LED circuit boards in assemblies 33 and 34, through shaft 32 and across rotating plate 31. Leads 122 and 124 pass through openings 123 and 126, respectively. FIG. 2B is a bottom view of plate 31 which more clearly illustrates the path of the power leads. As shown in this view, leads 124 and 122 are connected to outer commutator ring 120 and inner commutator ring 121, respectively.

Figure 2C:
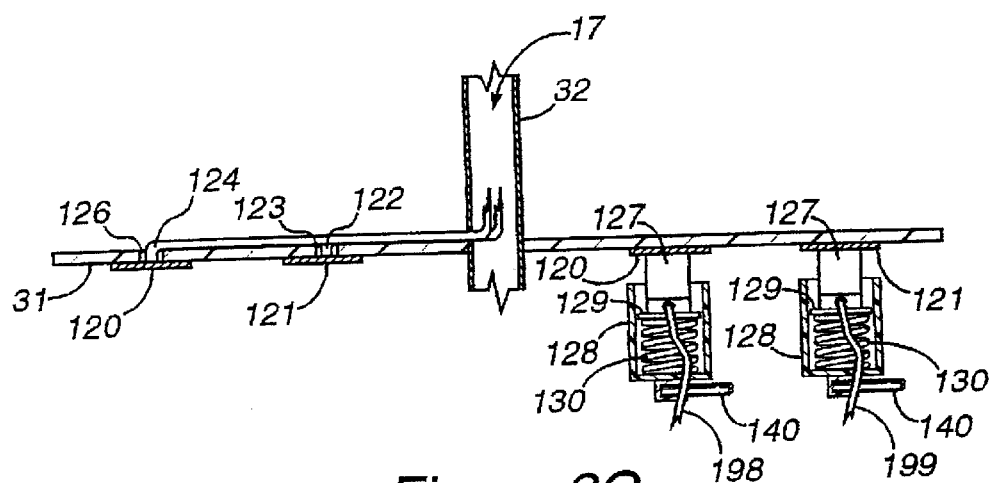
FIG. 2C is a fragmentary cross-sectional view of the embodiment shown in FIG. 2A, intended to illustrate the commutator of the invention, taken generally at line IIc—IIc in FIG. 2A.

The commutator assembly is illustrated in FIG. 2C which is a fragmentary cross-sectional view of the invention taken generally along line IIc—IIc in FIG. 2A.

Commutator rings 120, and 121 are flat annular electrical conductors (copper) fixedly secured to plate 31. Commutator carbon brushes 127 are housed in brush housing 128 and braised upwardly by spring 130 connected to plate 129. Electrical conductors 198 and 199 connect brushes 127 to a drive circuit lamp supply line and to ground, respectively. Thus, it is seen that the commutator provides electrical power to the LEDs.

Figure 3A:
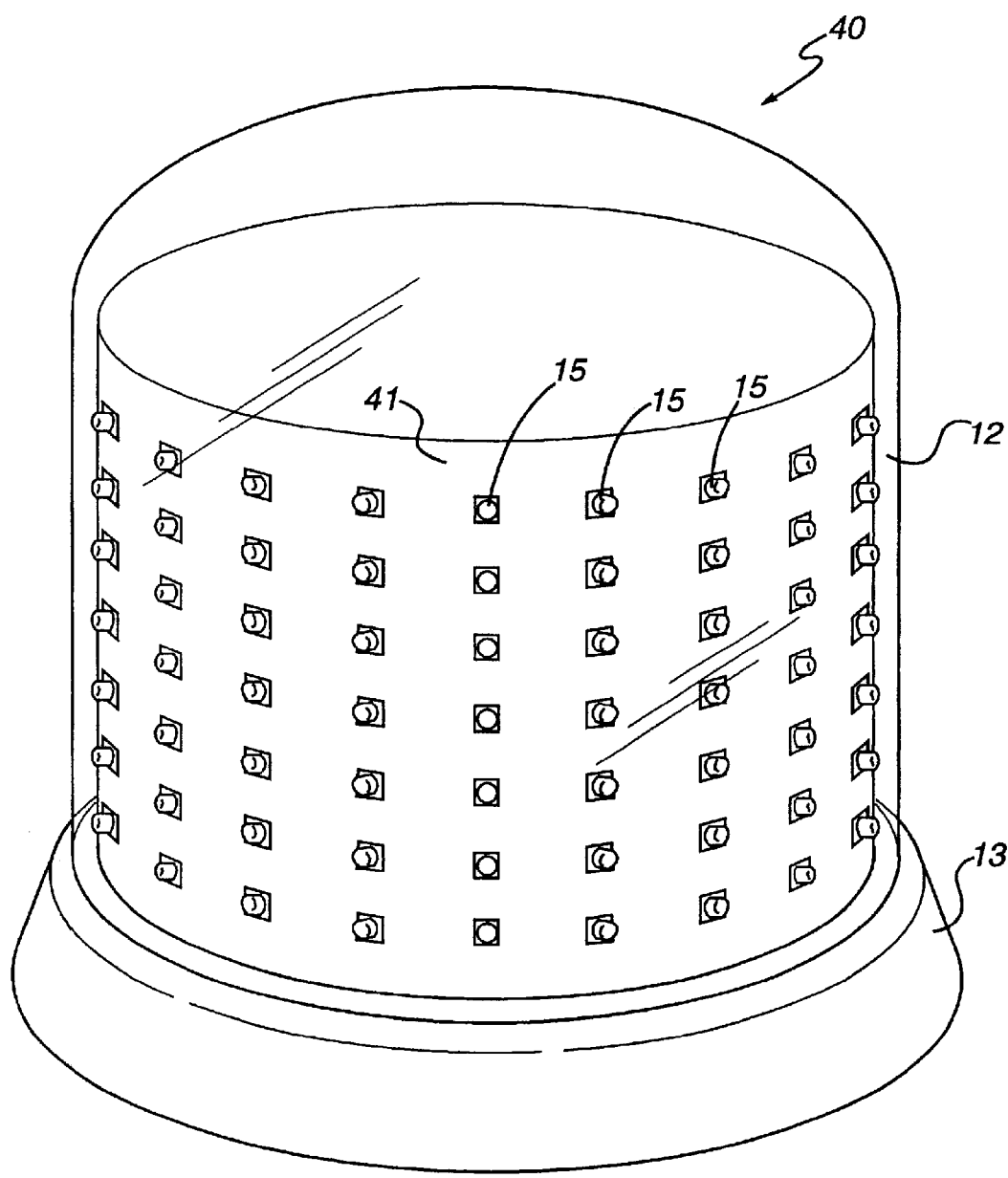
FIG. 3A is a perspective view of a third embodiment of the invention.
Figure 8B:
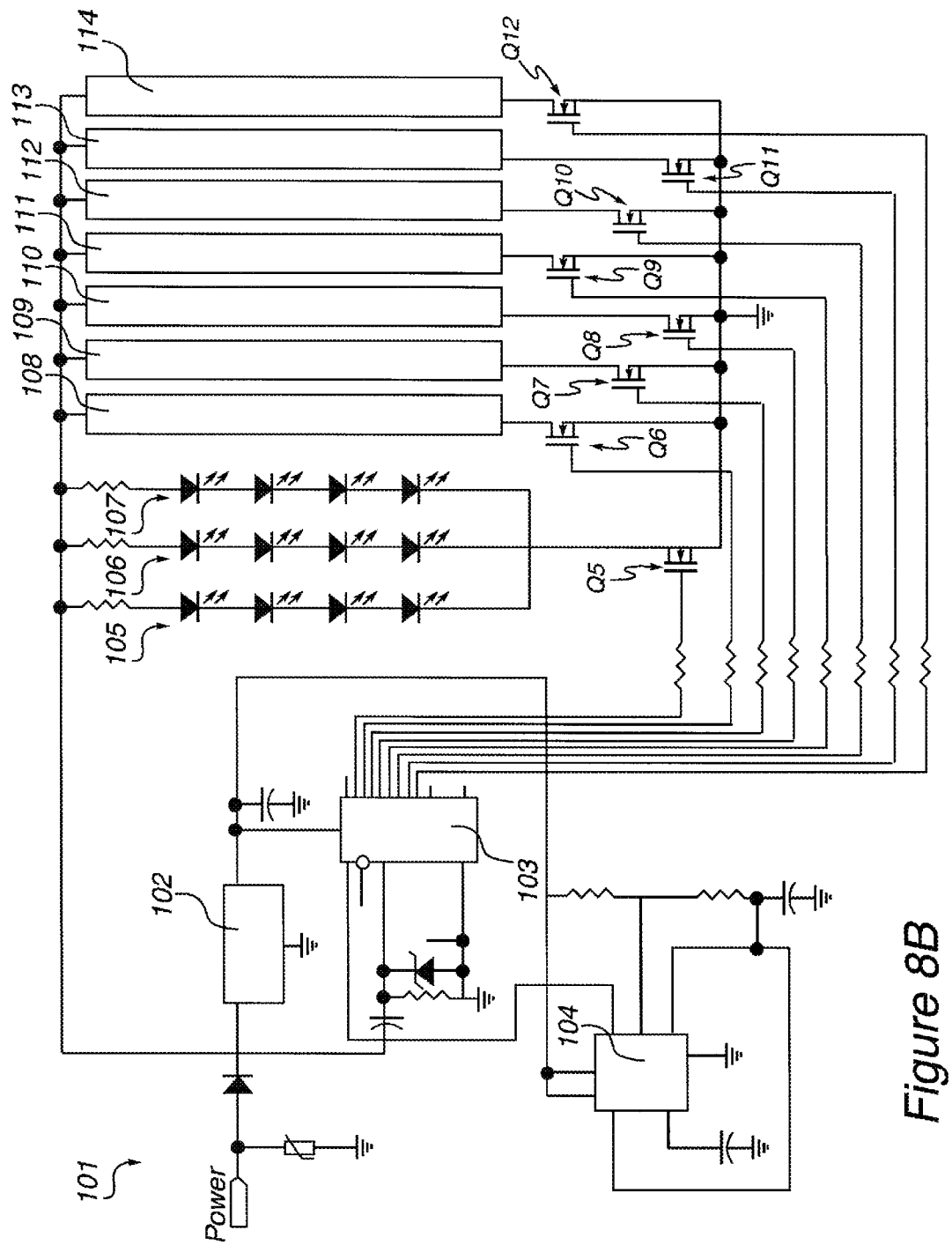
FIG. 8B is a schematic diagram of an alternative driving circuit which can sequentially activate LEDs or rows of LEDs.

FIG. 3A illustrates a third embodiment 40 of the warning lamp of the invention. In this embodiment, plurality of LEDs 15 are mounted to flexible circuit board 41 which, in turn, is mounted to base 13. Various flexible circuit boards are known in the art, and are suitable for use in this embodiment. For example "Bend/flex®" formable circuit board from Rogers Corporation is suitable, as are products from Sheldahl Corporation, of Northfield, Minn. In this embodiment, the LEDs would be programmed to flash at a rate of 0.8 Hz to 2.2 Hz by the driving circuit shown in FIG. 8A. Alternatively, the LEDs could be caused to flash in sequential vertical rows (one or more rows at a time). If the sequential flashing of rows is done at a fast enough rate, the effect to a fixed observed is a perceived flashing light. A sequential driving circuit is illustrated in FIG. 8B.

Figure 3B:
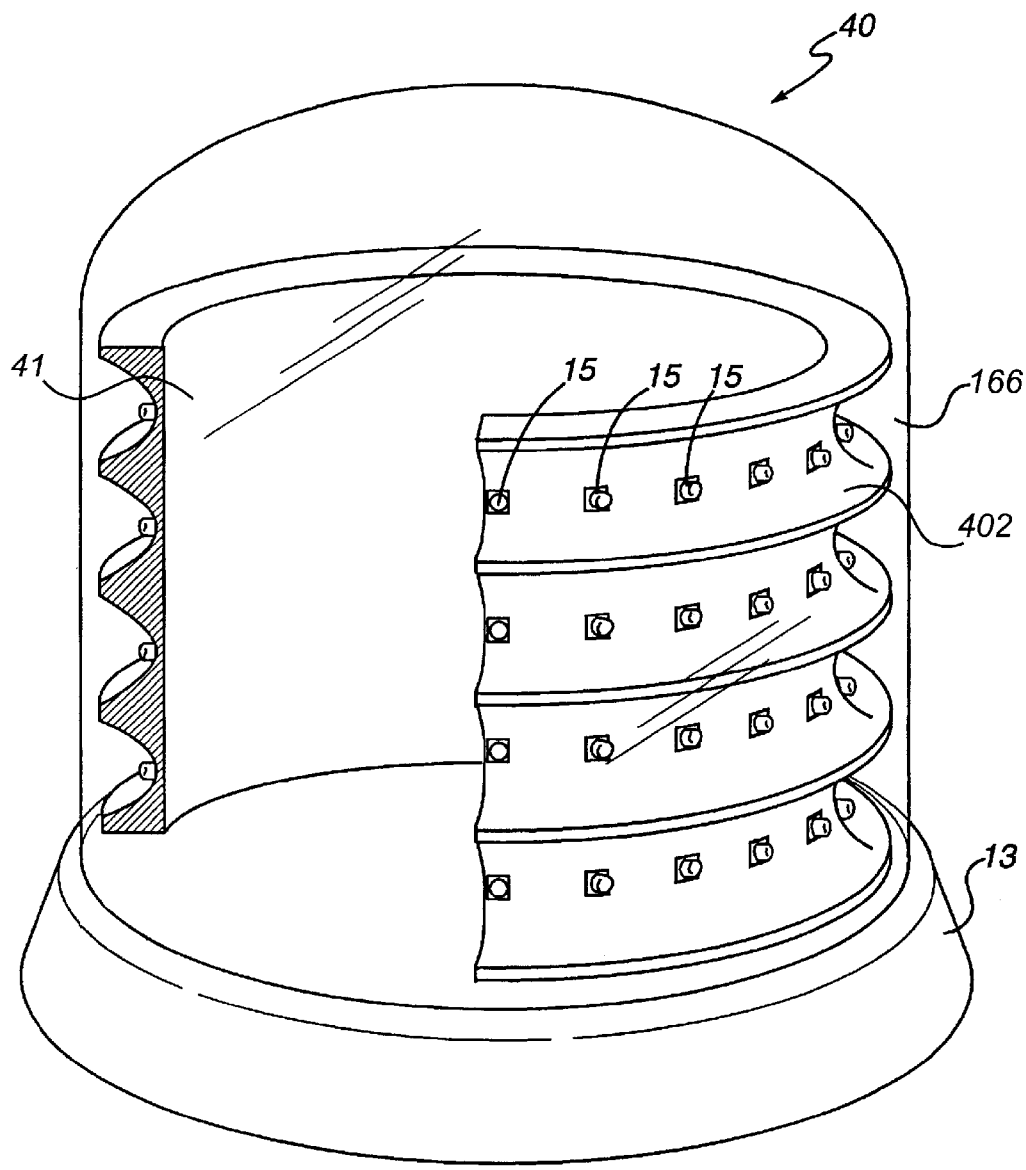
FIG. 3B is a view similar to that of FIG. 3A, but showing additional reflectors.

FIG. 3B is a view of the embodiment of the invention shown in FIG. 3A, but including flexible circuit board 41 with radial collimating reflector 402. This reflector directs and focuses the light in a 360° arc about the assembly. Again, the LEDs could be flashed all at one time, or in sequential rows.

Figure 3C:
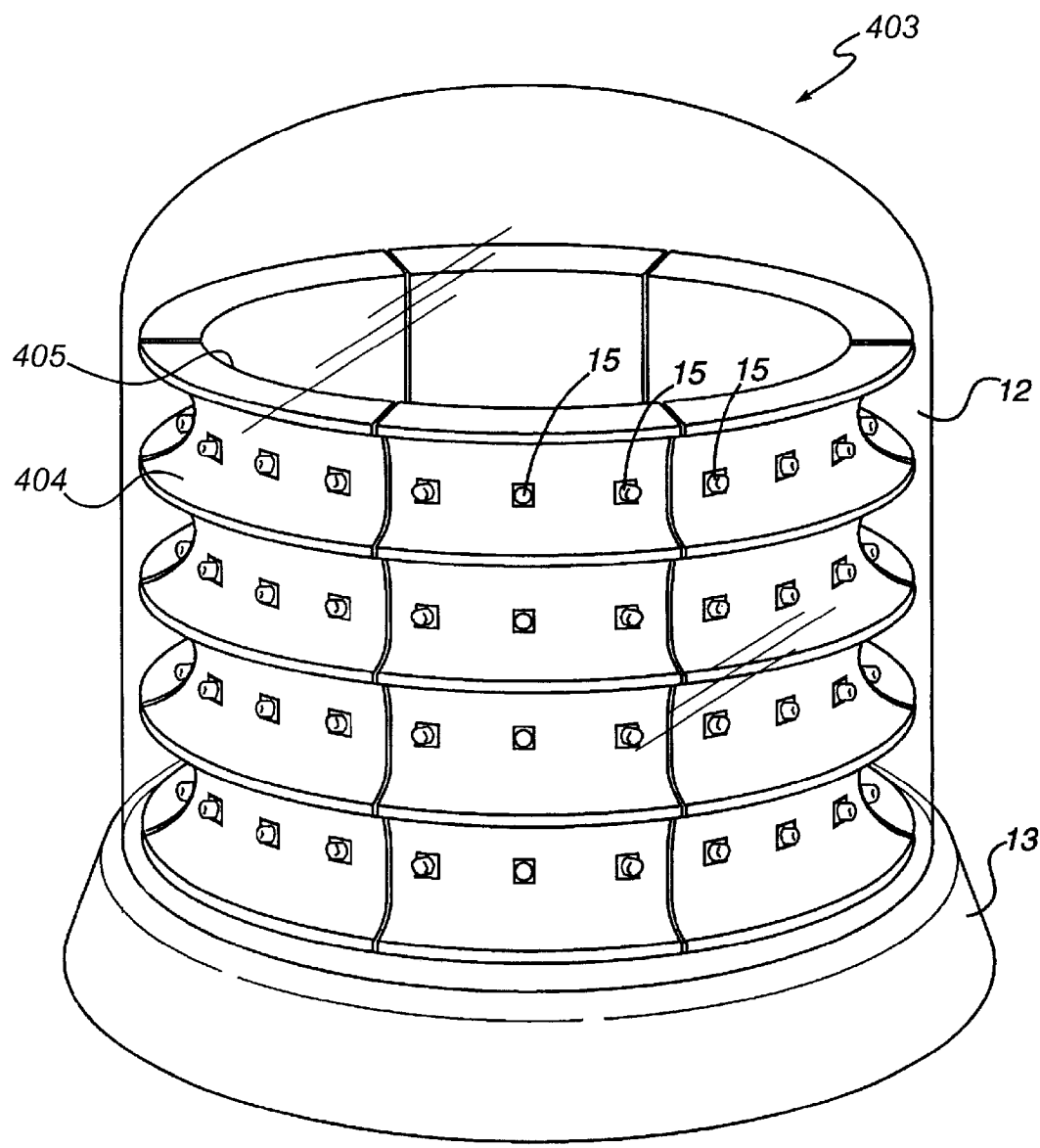
FIG. 3C is a view similar to that of FIG. 3B, but showing six separate flexible circuit boards and corresponding reflectors.

FIG. 3C shows LED warning lamp 403, yet another version of the embodiment shown in FIG. 3A. In this version, the LEDs are mounted on six distinct flexible circuit boards 405, and each has its own collimating reflector 404.

Figure 3D:
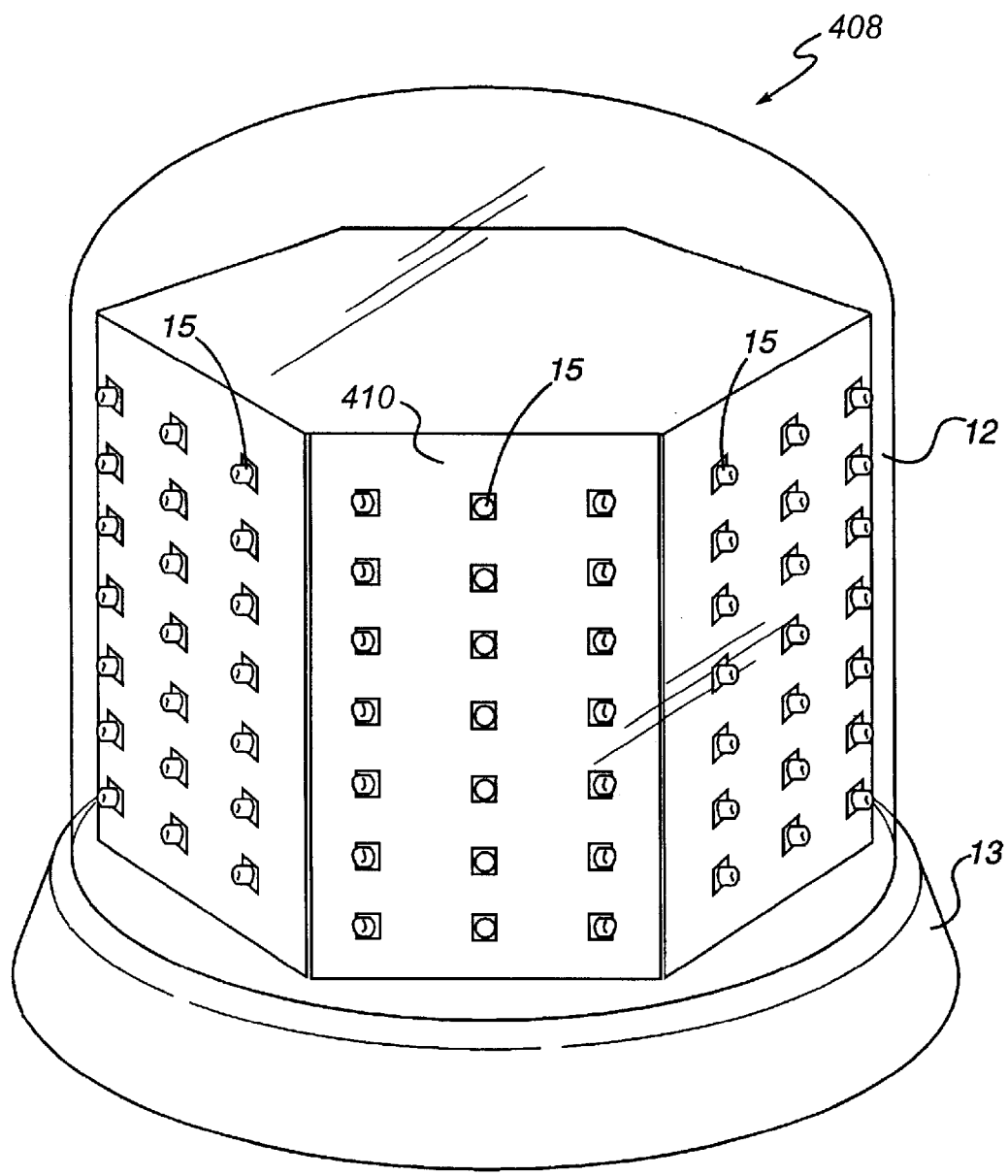
FIG. 3D is a view similar to that of FIG. 3A which utilizes six planar circuit boards arranged in a hexagon instead of one flexible board.

Finally, LED warning lamp 408 shown in FIG. 3D is a version similar to that shown in FIG. 3C except that the collimating reflector has been removed and the LEDs are mounted on six planar circuit boards 410 arranged in a hexagon.

Figure 4A:
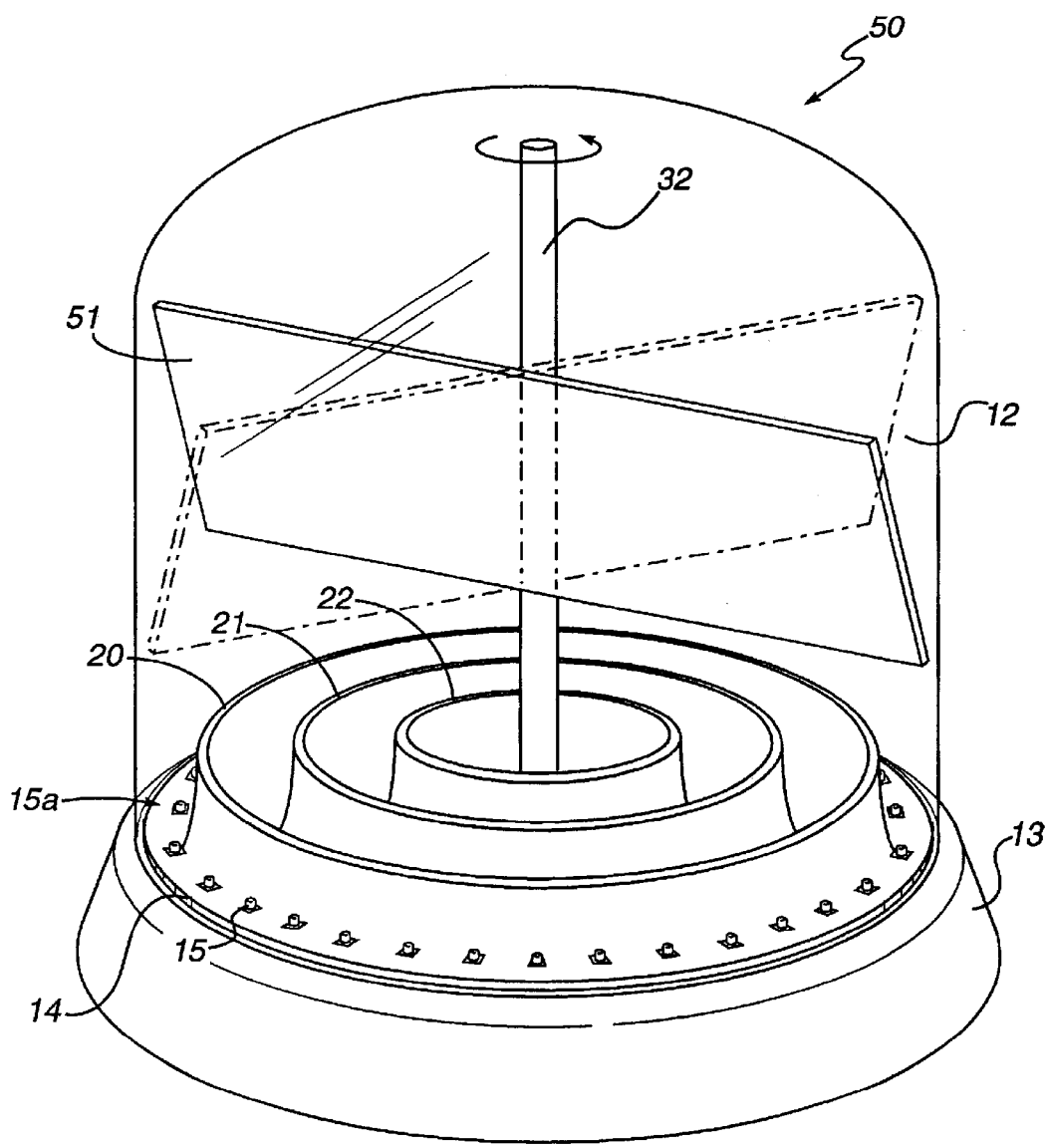
FIG. 4A is a perspective view of a fourth embodiment of the invention.

FIG. 4A illustrates a fourth embodiment 50 of the warning lamp of the invention. In this embodiment, planar reflector 51 is mounted at approximately a 45° angle to rotatable post 322. The post rotation rate and LED flash rate are coordinated as described with reference to the second embodiment shown in FIG. 2A.

Figure 4B:
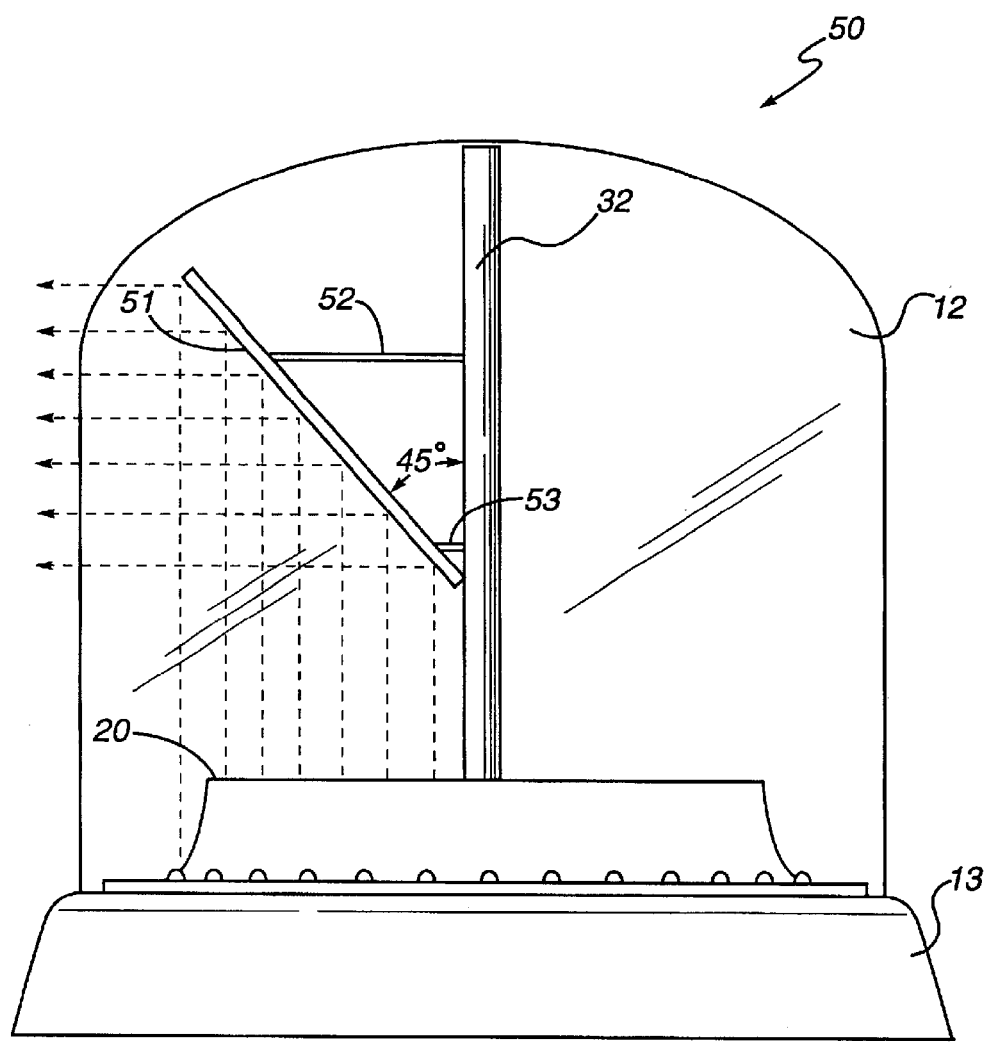
FIG. 4B is a side perspective view of the fourth embodiment of the invention shown in FIG. 4.

The mounting of reflector 51 to post 322 is illustrated in FIG. 4B. The reflector is fixedly secured to post 322 by brackets 52 and 53. As shown in the drawing, the reflector is mounted at approximately a 45° angle relative to post 322. Also as shown by the dotted arrow lines, light from the LEDs is reflected radially outward from the housing. As post 322 rotates through a full revolution, the reflected light spans an arc of 360°.

Figure 5A:
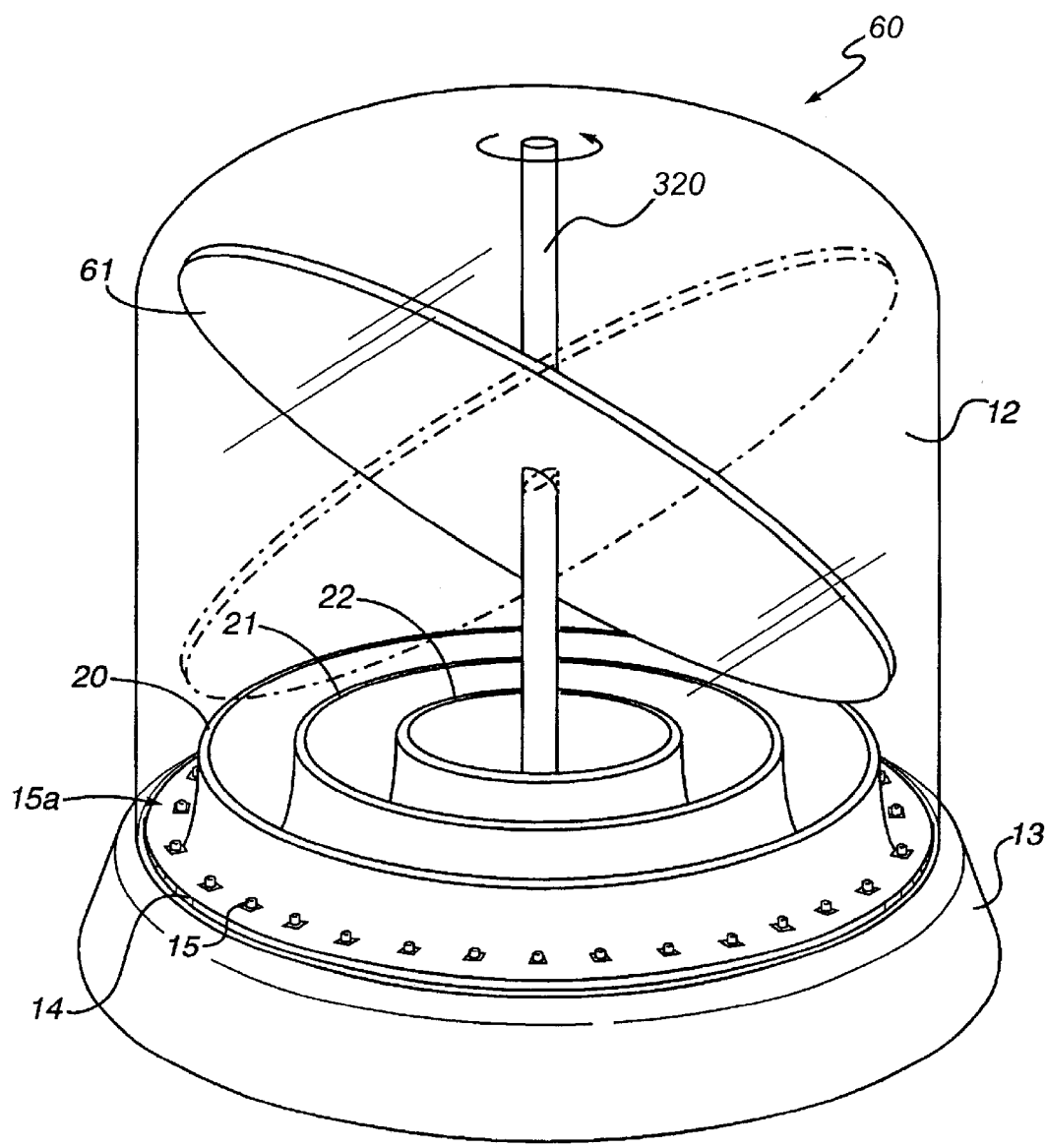
FIG. 5A is a perspective view of a fifth embodiment of the invention.
Figure 5B:
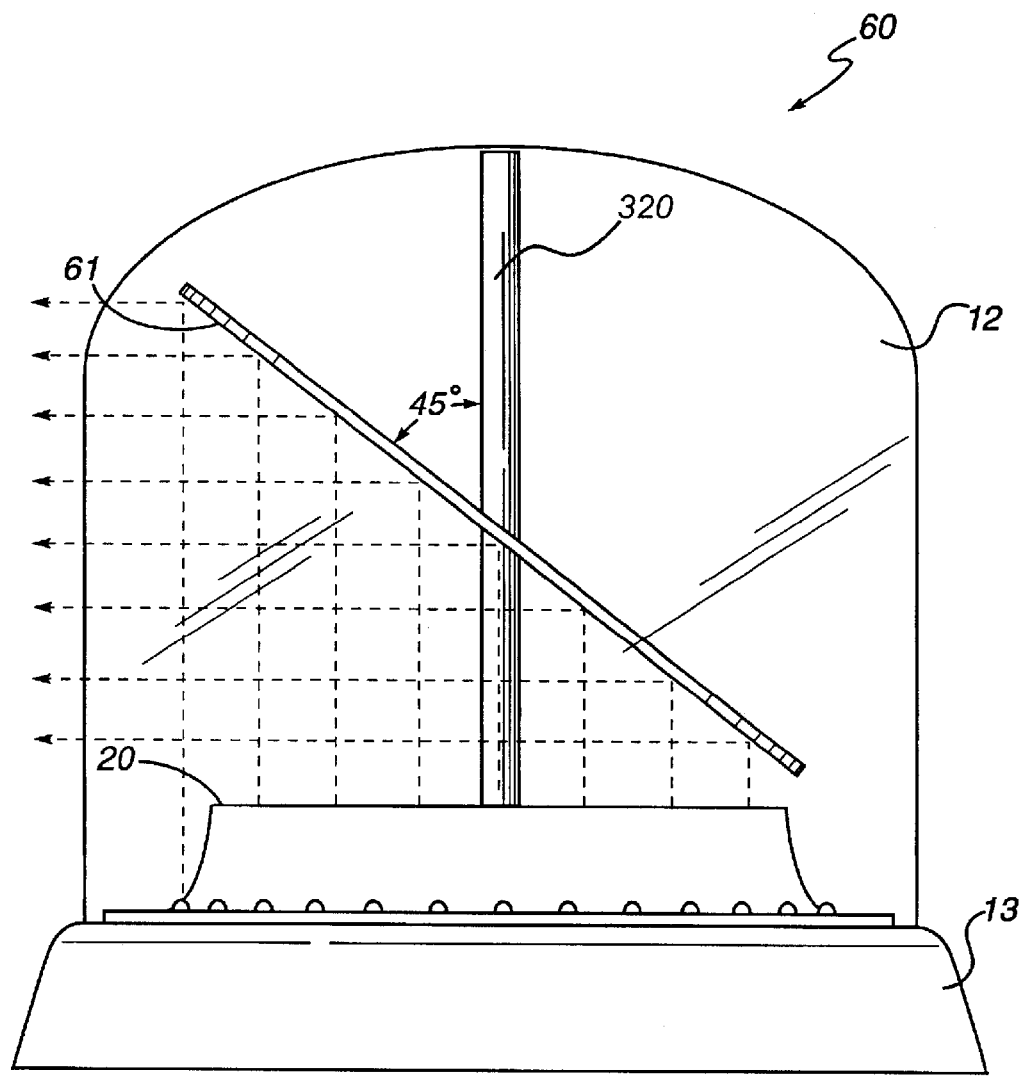
FIG. 5B is a side perspective view of the fifth embodiment of the invention shown in FIG. 5.

FIG. 5A illustrates a fifth embodiment 60 of the warning lamp of the invention. In this embodiment, elliptical reflector 61 is mounted to rotatable post 320. As shown in the drawing, the reflector is mounted at approximately a 45° angle relative to the vertical plane, and at approximately a 45° angle relative to the horizontal plane. The rotational speed of the post is adjusted to provide an effective flash rate of 0.8 Hz to 2.2 Hz, or 48–132 flashes/minute (@1 flash per rotation). The mounting of reflector 61 to post 320 is shown in a side perspective view in FIG. 5B. The reflector has a through-bore in its geometric center and the post passes through the through-bore and is fixedly secured to the wall thereof. As shown in FIG. 5B, reflector 61 is deposed at a 45° angle relative to post 320.

Figure 6:
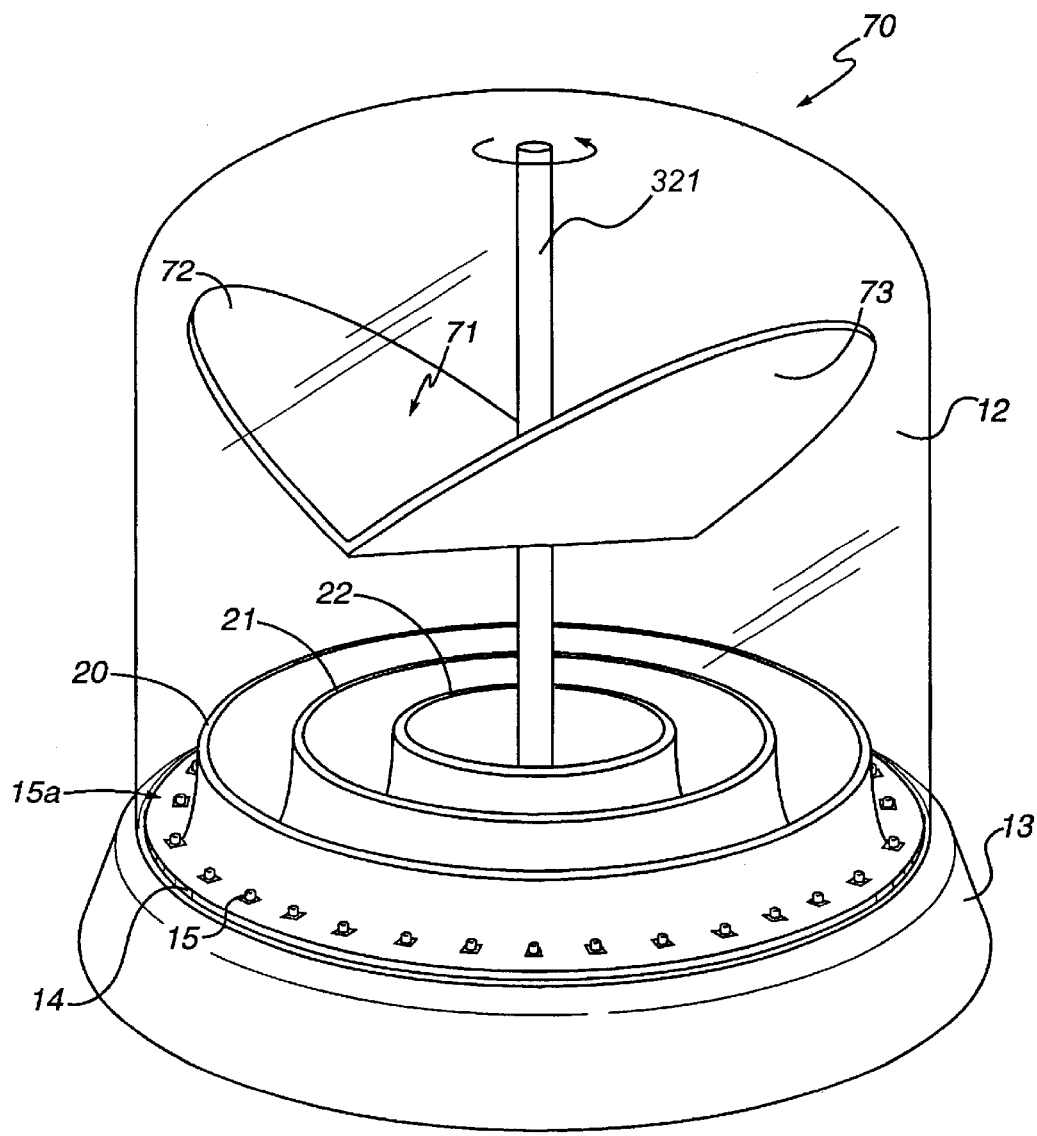
FIG. 6 is a perspective view of a sixth embodiment of the invention.

FIG. 6 illustrates a sixth embodiment 70 of the warning lamp of the invention. In this embodiment, elliptical reflector 71 comprises first section 72 and second section 73 which are disposed at right angles with respect to one another, and at 45° angles relative to the post, and relative to the circuit board. Post 321 is operatively arranged for rotation. The flash rate of this embodiment is determined by the rotational speed of the post, and can easily be adjusted to provide an effective flash rate of 0.8 Hz to 2.2 Hz, or 48–132 flashes/minutes (@2 flashes per rotation).

Figure 7A:
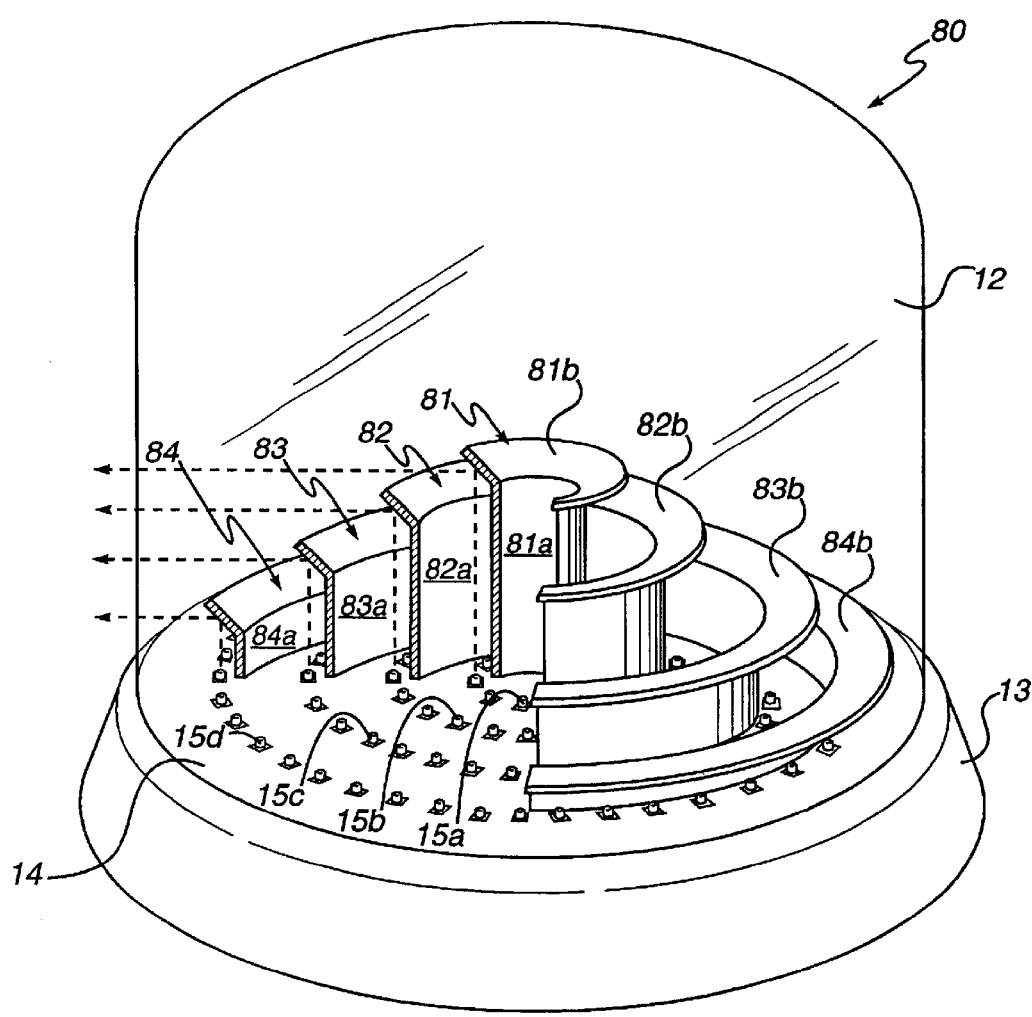
FIG. 7A is a perspective view of a seventh embodiment of the invention.
Figure 7B:
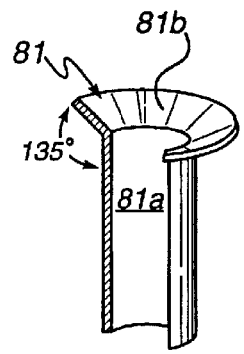
FIG. 7B is a fragmentary perspective view of one of the tiered reflectors of the seventh embodiment of the invention.

Finally, FIG. 7A illustrates a seventh embodiment 80 of the warning lamp of the invention. This embodiment comprises plurality of LEDs 15 mounted in concentric circular patterns 15a, 15b, 15c and 15d to circuit board 14, and a plurality of tiered reflectors 81,82,83, and 84, operatively arranged to reflect the emitted light from the LEDs radially outward from the housing in a 360° arc. Each tiered reflector comprises a cylindrical section and an annular section. For example, reflector 81 comprises cylindrical section 81a and annular section 81b disposed at approximately a 135° angle relative to the cylindrical section, as best shown in FIG. 7B. The reflectors are arranged from the center outwardly in decreasing height. In other words, reflector 81 is taller than reflector 82; reflector 82 is taller than reflector 83; and reflector 83 is taller than reflector 84.

Figure 7C:
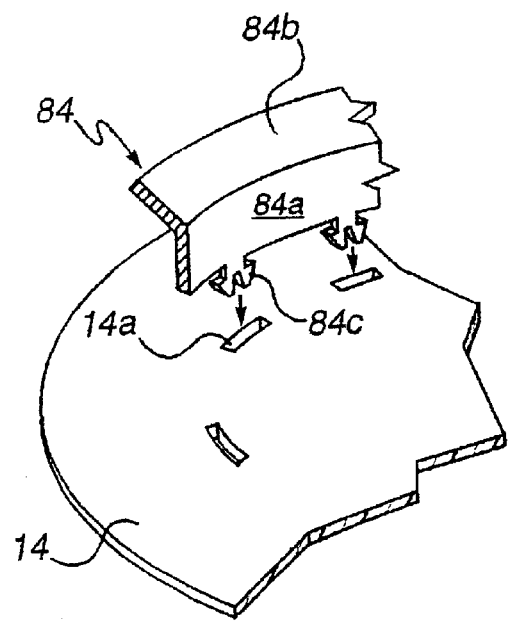
FIG. 7C is a fragmentary perspective view illustrating one method of securing a tiered reflector to the circuit board.
Figure 7D:
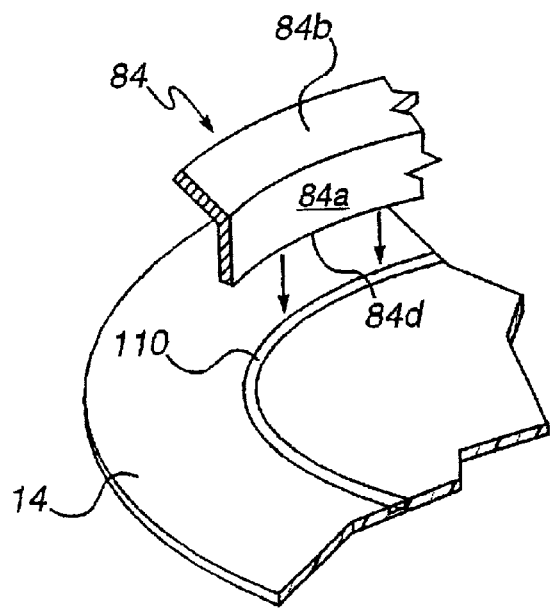
FIG. 7D is a fragmentary perspective view illustrating a second method of securing a tiered reflector to the circuit board.
Figure 7E:
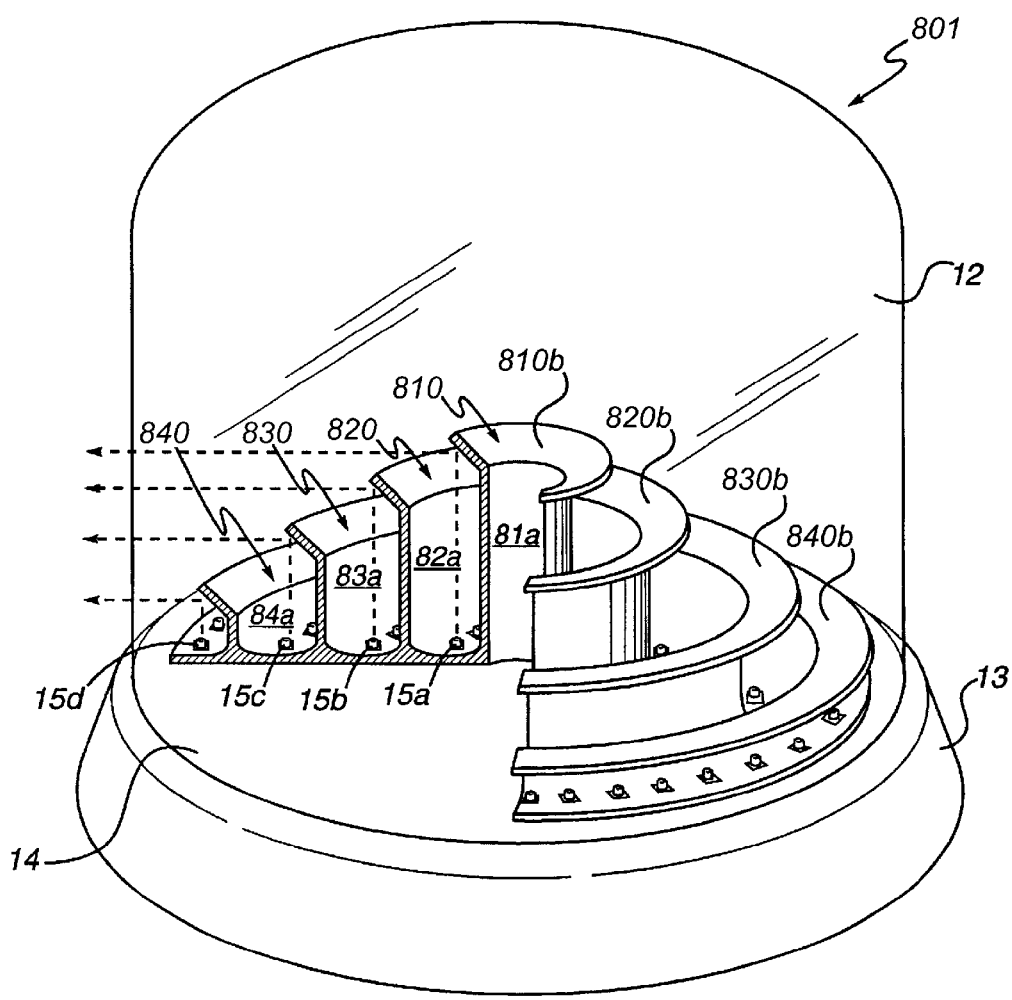
FIG. 7E, similar to that of FIG. 7A, shows the LEDs disposed within the reflectors.

The various reflectors of the invention may be fastened to the printed circuit board in a number of ways, dependent upon the material of which the reflectors are made. As shown in FIG. 7C, plastic reflector 81 could be molded with multiple snap fit features 84c about the bottom edge circumference of the reflector pieces. These snaps would be forced into slots 14a in the printed circuit board which holds the reflectors in place. Alternatively, reflector 81 could be stamped metal, die cast, or turned which can be spot welded or soldered to metal ring 110 bonded to the printed circuit board as shown in FIG. 7D. Die cast reflectors are also envisioned—cast in fasteners could be passed through the circuit board and headed over or held with one-way push in fasteners. Alternatively, die cast reflectors could include holes which would receive self-tapping screws. Obviously, these are but a few of the ways the reflectors could be attached. These methods can be used to affix the tiered reflectors shown in FIG. 7A and the collating reflectors shown in FIGS. 1A, 4A, 5A and 6.

The LED warning lamp 801, shown in FIG. 7D, is similar to the embodiment shown in FIG. 7A. In this embodiment, however, LEDs 15 are disposed within tiered reflectors 810, 820, 830, and 840, operatively arranged to reflect the emitted light from the LEDs radially outward from the housing in a 360° arc.

FIG. 8A illustrates one version of a driving circuit which may be used to drive the LEDs of each embodiment. The circuit comprises a regulator circuit which supplies power to an oscillator circuit and a pair of monostable (oneshot) oscillators which drive the LED array. The output of each oneshot is connected to an OR gate, the output of which is connected to a transistor switch which controls the illumination of the LED lamps. In operation the oscillator produces an "on" pulse of relatively short duration followed by a relatively long "off" duration. This signal is applied simultaneously to each oneshot. However, the first oneshot is configured to trigger on the positive going edge of the pulse and the second is configured to trigger on the negative going edge of the pulse. The timing of each oneshot is set at some duration less than that of the oscillator's on-time; thus the two oneshots produce short duration pulses in sequence followed by a relatively long rest period. The output is combined in the OR gate and applied to the transistor switch thus producing flashes of light from the LED lamp that correspond to the output of the OR gate. The result is two short duration flashes of light followed by a relatively long rest period followed by the two short duration flashes and so on. The circuitry may be enclosed within one lamp unit and fed to other lamps in a "Master, Slave" configuration or may be located outside of the lamp unit in a separate encapsulated module. The LEDs themselves are preferably connected in parallel. An obvious advantage of a parallel connection is that even if one or more LEDs should fail or malfunction, the lamp would likely still operate as intended.

In more detail, the driving circuit consists of integrated circuits U1 (an LM7812 three terminal fixed positive 12 volt voltage regulator), U2 (an NE555 timer), U3 (a 4098 CMOS dual oneshot multivibrator); diodes D3 and D4 (which form a diode or gate); and transistor Q1 (an N channel power MOSFET).

The voltage regulator circuit, consisting of capacitors C1, C2, and the LM7812, holds the voltage at a constant 12 volts for operation of the circuit. The NE555 timer is configured in a typical form as a pulse generator with diodes D1 and D2, capacitor C4, and resistors R1 and R2 chosen to produce a pulse width of about 140 milliseconds, and a pulse recurrent time of about 1.3 seconds. The timing components of both halves of the 4098 oneshot (C5 and R3, and C6 and R4) are chosen to produce a pulse width of about 80 milliseconds. The output from pin 3 of the NE555 (U2) is applied to both halves of the 4098 simultaneously, however, the signal is applied to the positive trigger input (pin 4 of U3A) of one and the negative trigger input of the other (pin 11 of U3B). The result is that there is an 80 msec pulse produced at pin 6 of U3A upon the positive going transition of the output pulse from U2 and another produced at pin 10 of U3B upon the negative going transition of the output from U2. The outputs from pins 6 and 10 are combined in a diode "or" gate formed by diodes D3 and D4. The result is a pair of pulses of 80 msec duration separated by approximately 60 msec of off time recurring every 1.3 seconds. The output of the "or" gate is applied to the transistor which is used to switch the ground to an LED lamp or plurality of LED lamps 15 to produce an "attention getting," strobe-like", double flash separated by about 1.2 second of off time and then repeating as long as the power is applied.

It should be appreciated that the driving circuit shown in FIG. 8A is but one example of a suitable LED driver circuit. Programmable circuits, as well as other driving circuits, are readily known in the art. One such circuit is illustrated in FIG. 8B. This circuit is designed to sequentially flash a plurality of LEDs or groups or rows of LEDs. The circuit broadly comprises voltage regulator 102 (LM732 or equivalent), free running 555 timer 104 which drives 4017 CMOS decade counter 103, which, in turn, drives LED arrays 105–114 through MOSFET switches Q5–Q12. The MOSFET switches connect the arrays to ground in sequence, producing the appearance of rotation.

Several of the disclosed embodiments include a stationary LED array and a rotating reflector (see FIGS. 4A, 4B, 5A, 5B, and 6). In these embodiments, the reflector is mounted to a rotating post. Although the post may be rotated in a number of ways known in the art, a preferred drive mechanism is shown in FIGS. 9 and 10.

Figure 9:
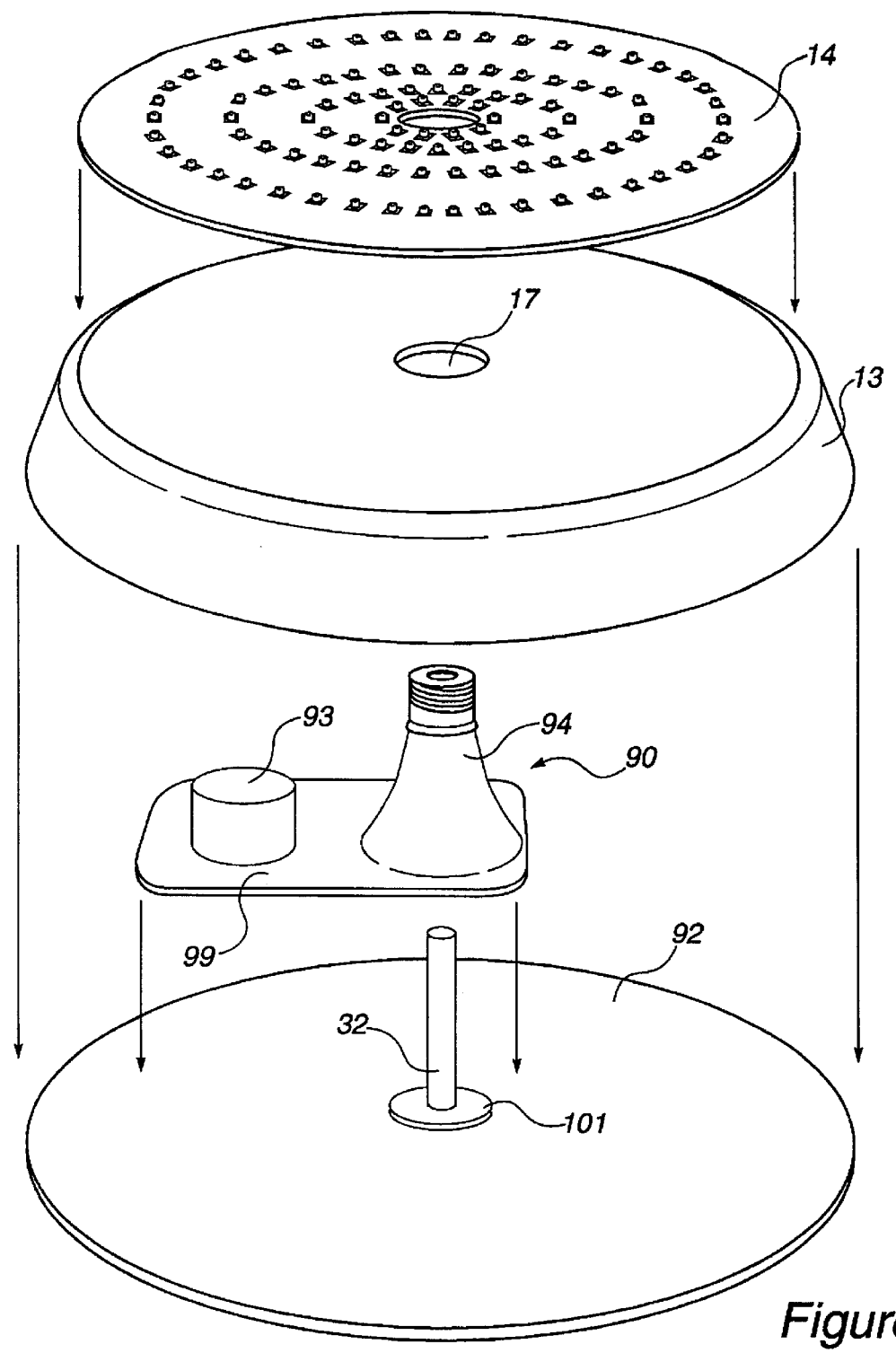
FIG. 9 is an exploded perspective view of the drive mechanism for the rotating post of the second, fourth, fifth and sixth embodiments of the invention.
Figure 10:
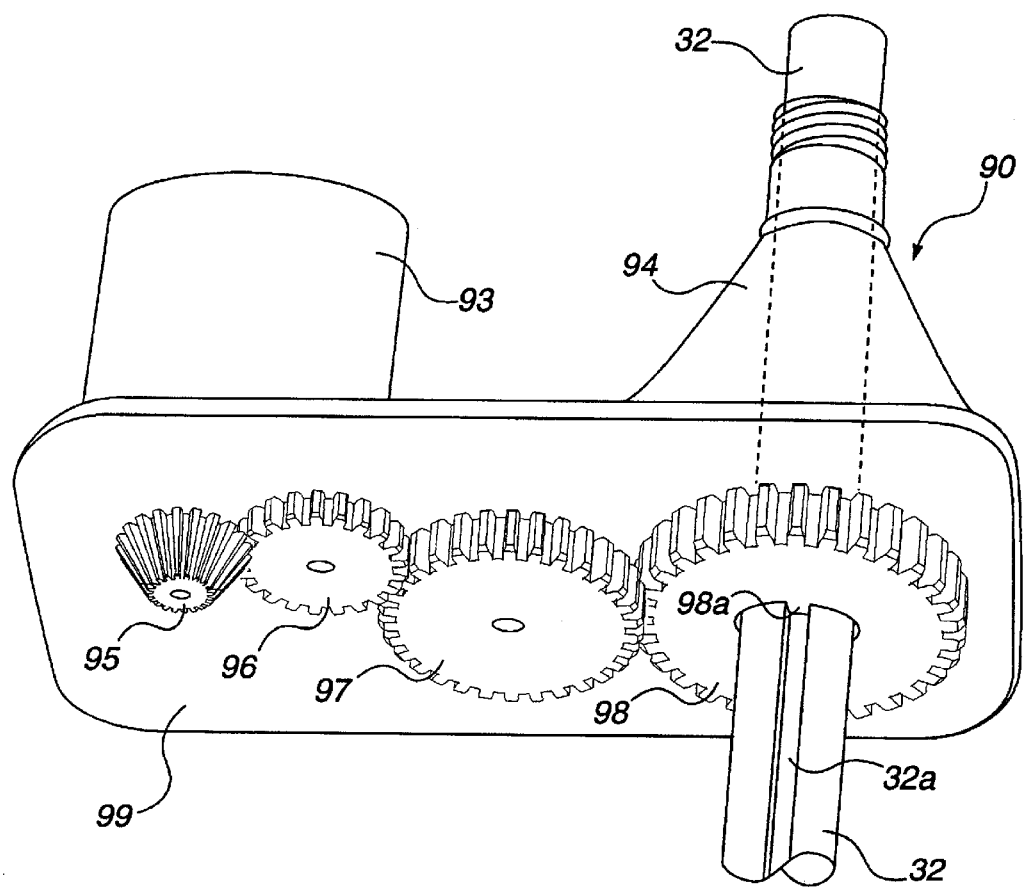
FIG. 10 is a fragmentary perspective view of the underside of the drive mechanism of the invention shown in FIG. 9.

As shown in FIG. 9, post 32 is supported by bearing 101 mounted to base plate 92. Post 32 is freely rotatable in bearing 101. Post 32 is keyed as shown in FIG. 10 (see keyway 32a). Drive unit 90 comprises base plate 99, motor unit 93 and gear 94. Motor 93 turns drive gear 95 which, in turn, drives gears 96, 97 and 98. Gear 98 is fixedly secured to post 32 by key 98a. The post is thus rotated by the motor. The post protrudes through an opening in the drive unit, through opening 17, and through an opening in the printed circuit board.

Although our invention is described by reference to specific preferred embodiments, it is clear that variations can be made without departing from the spirit of the invention as claimed.

What we claim is:

1. A light assembly, comprising:
   a housing having a base;
   a printed circuit board secured to said base;
   a plurality of light emitting diodes mounted to said printed circuit board and operatively arranged to produce light which is directed away from said base;
   a driver circuit operatively arranged to drive said plurality of light emitting diodes;
   a main reflector operatively arranged to reflect substantially all of the light produced by said plurality of light emitting diodes; and
   a plurality of concentrically disposed collimating reflectors mounted to said printed circuit board and operatively arranged to collimate the light produced by said plurality of light emitting diodes and to direct the light toward said main reflector.

2. A light assembly as recited in claim 1 wherein said plurality of light emitting diodes are arranged in concentric patterns upon said printed circuit board.

3. A light assembly as recited in claim 1 wherein said main reflector is operatively arranged to reflect the light produced by said plurality of light emitting diodes in a 360° arc about the light assembly.

4. A light assembly as recited in claim 1 wherein said light assembly produces white light having a flash energy of at least 40 candela-seconds measured at a distance of at least 18 meters away from said light assembly.

5. A light assembly as recited in claim 1 wherein said light assembly produces yellow light having a flash energy of at least 20 candela-seconds measured at a distance of at least 18 meters away from said light assembly.

6. A light assembly as recited in claim 1 wherein said light assembly produces red light having a flash energy of at least 10 candela-seconds measured at a distance of at least 18 meters away from said light assembly.

7. A light assembly as recited in claim 1 wherein said light assembly produces signal blue light having a flash energy of at least 5 candela-seconds measured at a distance of at least 18 meters away from said light assembly.

8. A light assembly as recited in claim 1 wherein said main reflector comprises a non-reflective stem portion and a reflective frustoconical portion.

9. A light assembly as recited in claim 1 wherein said main reflector is secured to said cover.

10. A light assembly as recited in claim 1 wherein said housing further comprises a cover secured to said base and enclosing said printed circuit board, said main reflector and said plurality of light emitting diodes.

11. A light assembly as recited in claim 10 wherein said cover is translucent.

12. A light assembly as recited in claim 10 wherein said cover is transparent.

13. A light assembly as recited in claim 10 wherein said cover is clear in color.

14. A light assembly as recited in claim 10 wherein said cover is red in color.

15. A light assembly as recited in claim 10 wherein said cover is amber in color.

16. A light assembly as recited in claim 1 wherein said driving circuit is operatively arranged to flash said light emitting diodes.

17. A light assembly as recited in claim 16 wherein said driving circuit produces an effective flash rate in the range of 0.8 to 2.2 Hz.

18. A light assembly as recited in claim 17 wherein said driving circuit flashes all of said light emitting diodes at once to produce said effective flash rate.

19. A light assembly as recited in claim 17 wherein said driving circuit sequentially flashes said light emitting diodes about the perimeter of said base to produce said effective flash rate.

20. A light assembly as recited in claim 1 further comprising a rotatable post operatively mounted at the center of said base and means for rotating said post, wherein said main reflector is mounted to said rotatable post.

21. A light assembly as recited in claim 20 wherein said main reflector comprises a first section and a second section; wherein said first section is mounted approximately 45° to said post and said second section is mounted approximately 45° to said post such that said second section is disposed at a right angle to said first section.

22. A light assembly as recited in claim 20 wherein said post rotates at a speed to create an effective flash rate in the range of 0.8 to 2.2 Hz.

23. A light assembly as recited in claim 20 wherein said main reflector is mounted approximately 45° to said post.

24. A light assembly as recited in claim 23 wherein said main reflector is planar.

25. A light assembly as recited in claim 23 wherein said main reflector is elliptical.

26. A light assembly, comprising
   a housing having a base;
   a post mounted at the center of said base and operatively arranged for rotation; means for rotating said post;
   at least one light emitting diode light source mounted to said post;
   a driver circuit operatively arranged to drive said at least one light emitting diode light source; wherein an effective flash occurs each time one of said light sources passes a fixed point, and wherein said post rotates at a speed to create an effective flash rate in the range of 0.8 to 2.2 Hz.

27. A light assembly as recited in claim 26 wherein said at least one light emitting diode light source produces light in substantially a 360° arc surrounding said housing in a horizontal plane.

28. A light assembly as recited in claim 26 wherein said at least one light emitting diode light source comprises two diametrically opposed light emitting diode arrays, each said array containing a plurality of light emitting diodes arranged to direct light away from said post and toward said housing.

29. A light assembly as recited in claim 26 further comprising a cover mounted to said base.

30. A light assembly as recited in claim 26 wherein said means for rotating said post comprises a motor/gear combination.

31. A light assembly as recited in claim 26 wherein said light assembly produces white light having a flash energy of at least 40 candela-seconds measured at a distance of at least 18 meters away from said light assembly.

32. A light assembly as recited in claim 26 wherein said light assembly produces yellow light having a flash energy of at least 20 candela-seconds measured at a distance of at least 18 meters away from said light assembly.

33. A light assembly as recited in claim 26 wherein said light assembly produces red light having a flash energy of at least 10 candela-seconds measured at a distance of at least 18 meters away from said light assembly.

34. A light assembly as recited in claim 26 wherein said light assembly produces signal blue light having a flash energy of at least 5 candela-seconds measured at a distance of at least 18 meters away from said light assembly.

35. A light assembly, comprising:
   a housing having a base;
   a flexible printed circuit board arranged substantially perpendicularly to and about the perimeter of said base and secured thereto;
   a plurality of light emitting diodes mounted to said printed circuit board and operatively arranged to produce light which is directed away from said printed circuit board; and
   a driver circuit operatively arranged to drive said plurality of light emitting diodes and produce an effective flash rate in the range of 0.8 to 2.2 Hz.

36. A light assembly as recited in claim 35 wherein said plurality of light emitting diodes produce light in substantially a 360° arc surrounding said housing in a horizontal plane.

37. A light assembly as recited in claim 35 further comprising a cover secured to said base and enclosing said printed circuit board.

38. A light assembly as recited in claim 35 wherein said light assembly produces white light having a flash energy of at least 40 candeia-seconds measured at a distance of at least 18 meters away from said light assembly.

39. A light assembly as recited in claim 35 wherein said light assembly produces yellow light having a flash energy of at least 20 candela-seconds measured at a distance of at least 18 meters away from said light assembly.

40. A light assembly as recited in claim 35 wherein said light assembly produces red light having a flash energy of at least 10 candela-seconds measured at a distance of at least 18 meters away from said light assembly.

41. A light assembly as recited in claim 35 wherein said light assembly produces signal blue light having a flash energy of at least 5 candela-seconds measured at a distance of at least 18 meters away from said light assembly.

42. A light assembly as recited in claim 35 wherein said driving circuit is operatively arranged to flash all of said light emitting diodes at once to produce said effective flash rate.

43. A light assembly as recited in claim 35 wherein said driving circuit is operatively arranged to sequentially flash said light emitting diodes about the perimeter of said base to produce said effective flash rate.

44. A light assembly, comprising:
   a housing having a base;
   a plurality of printed circuit boards arranged about the periphery of said base and perpendicularly thereto;
   a plurality of light emitting diodes mounted to said printed circuit boards and operatively arranged to produce light which is directed away from said circuit boards; and
   a driver circuit operatively arranged to drive said plurality of light emitting diodes and produce an effective flash rate in the range of 0.8 to 2.2 Hz.

45. A light assembly as recited in claim 44 wherein said plurality of light emitting diodes produce light in substantially a 360° arc surrounding said housing in a horizontal plane.

46. A light assembly as recited in claim 44 further comprising a cover secured to said base and enclosing said plurality of printed circuit boards.

47. A light assembly as recited in claim 44 wherein said light assembly produces white light having a flash energy of at least 40 candela-seconds measured at a distance of at least 18 meters away from said light assembly.

48. A light assembly as recited in claim 44 wherein said light assembly produces yellow light having a flash energy of at least 20 candela-seconds measured at a distance of at least 18 meters away from said light assembly.

49. A light assembly as recited in claim 44 wherein said light assembly produces red light having a flash energy of at least 10 candela-seconds measured at a distance of at least 18 meters away from said light assembly.

50. A light assembly as recited in claim 44 wherein said light assembly produces signal blue light having a flash energy of at least 5 candela-seconds measured at a distance of at least 18 meters away from said light assembly.

51. A light assembly as recited in claim 44 wherein said driving circuit is operatively arranged to flash all of said light emitting diodes at once to produce said effective flash rate.

52. A light assembly as recited in claim 44 wherein said driving circuit is operatively arranged to sequentially flash said light emitting diodes about the perimeter of said base to produce said effective flash rate.

* * * * *

UNITED STATES PATENT AND TRADEMARK OFFICE
CERTIFICATE OF CORRECTION

PATENT NO.    : 6,679,618 B1
DATED         : January 20, 2004
INVENTOR(S)   : Suckow et al.

It is certified that error appears in the above-identified patent and that said Letters Patent is hereby corrected as shown below:

<u>Title page,</u>
Item [73], Assignee, "Truck Lite Co., Inc." should read -- Truck-Lite Co., Inc. --

Signed and Sealed this

Twenty-fifth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO.   : 6,679,618 B1
DATED        : January 20, 2004
INVENTOR(S)  : Suckow et al.

It is certified that error appears in the above-identified patent and that said Letters Patent is hereby corrected as shown below:

Column 4,
Line 58, "amp 10" should read -- lamp 10 --.

Signed and Sealed this

Twelfth Day of October, 2004

JON W. DUDAS
*Acting Director of the United States Patent and Trademark Office*